US012795833B2

(12) United States Patent
Seong et al.

(10) Patent No.: US 12,795,833 B2
(45) Date of Patent: Nov. 10, 2026

(54) FLEXIBLE CIRCUIT BOARD AND FOLDABLE ELECTRONIC DEVICE COMPRISING SAME

(71) Applicant: SAMSUNG ELECTRONICS CO., LTD., Suwon-si (KR)

(72) Inventors: Younghun Seong, Suwon-si (KR); Bumhee Bae, Suwon-si (KR); Euisung Kang, Suwon-si (KR); Hyeonhak Kim, Suwon-si (KR); Kanghyun Ryoo, Suwon-si (KR); Jaehoon Lee, Suwon-si (KR)

(73) Assignee: SAMSUNG ELECTRONIC CO., LTD., Gyeonggi-Do (KR)

( * ) Notice: Subject to any disclaimer, the term of this patent is extended or adjusted under 35 U.S.C. 154(b) by 360 days.

(21) Appl. No.: 18/230,444

(22) Filed: Aug. 4, 2023

(65) Prior Publication Data

US 2023/0413443 A1 Dec. 21, 2023

Related U.S. Application Data

(63) Continuation of application No. PCT/KR2021/018297, filed on Dec. 3, 2021.

(30) Foreign Application Priority Data

Feb. 4, 2021 (KR) ........................ 10-2021-0016335

(51) Int. Cl.

*H05K 1/14* (2006.01)
*G06F 1/16* (2006.01)

(Continued)

(52) U.S. Cl.

CPC ........... *H05K 1/147* (2013.01); *G06F 1/1652* (2013.01); *H05K 1/028* (2013.01); *H05K 1/118* (2013.01)

(58) Field of Classification Search

CPC ...... H05K 1/0219; H05K 1/147; H05K 1/028; H05K 1/118; H05K 1/0218; H05K 1/025;

(Continued)

(56) References Cited

U.S. PATENT DOCUMENTS 10,545,601 B2 1/2020 Gao et al.
10,666,780 B2 5/2020 Cho et al.

(Continued)

FOREIGN PATENT DOCUMENTS

CN 105555019 A 5/2016
CN 106470523 A 3/2017

(Continued)

OTHER PUBLICATIONS

Japanese Office Action corresponding to Application No. 2023-547046; Dated Nov. 11, 2025.

(Continued)

*Primary Examiner* — Roshn K Varghese
(74) *Attorney, Agent, or Firm* — CANTOR COLBURN LLP

(57) ABSTRACT

An electronic device can include a hinge structure; a flexible display which is folded or unfolded by the hinge structure; a first portion and a second portion which are close to and facing each other when folded by the hinge structure, and spaced apart when unfolded; a first circuit board disposed on the first portion; a second circuit board disposed on the second portion; and a flexible circuit board electrically connecting the first printed circuit board and the second circuit board. The flexible printed circuit board includes a first area which bends in response to the deformation of the electronic device, and a second region positioned around the first region that does not bend. The first region may include a single main signal wiring layer. The second portion may include a plurality of signal wiring layers. The first region (Continued)

and the second region may be formed to have different thicknesses.

21 Claims, 33 Drawing Sheets

(51) Int. Cl.
*H05K 1/02* (2006.01)
*H05K 1/11* (2006.01)

(58) Field of Classification Search
CPC .. H05K 1/0393; H05K 3/4691; H05K 5/0226; G06F 1/1652; G06F 1/1681; G06F 1/1683; H04M 1/0268; H04M 1/0274; H04M 1/0277; H04M 1/0269; H04M 1/0216
See application file for complete search history.

(56) References Cited

U.S. PATENT DOCUMENTS

| | | | | |
|---|---|---|---|---|
| 2005/0190531 | A1 | 9/2005 | Gall et al. | |
| 2006/0050490 | A1* | 3/2006 | Ootani | H05K 1/148 361/755 |
| 2007/0040626 | A1* | 2/2007 | Blair | H05K 1/147 333/1 |
| 2009/0133906 | A1* | 5/2009 | Baek | H05K 1/0218 29/830 |
| 2010/0128001 | A1 | 5/2010 | Kimura et al. | |
| 2012/0186860 | A1* | 7/2012 | Takaoka | H05K 1/028 174/254 |
| 2015/0338888 | A1 | 11/2015 | Kim et al. | |
| 2017/0013729 | A1 | 1/2017 | Rothkopf et al. | |
| 2017/0364123 | A1 | 12/2017 | Seo et al. | |
| 2018/0063941 | A1 | 3/2018 | Kang | |
| 2018/0196467 | A1 | 7/2018 | Watamura et al. | |
| 2018/0324964 | A1* | 11/2018 | Yoo | H05K 5/03 |
| 2019/0088388 | A1* | 3/2019 | Baba | H05K 1/11 |
| 2019/0269009 | A1 | 8/2019 | Park et al. | |
| 2020/0084888 | A1 | 3/2020 | Lee et al. | |
| 2021/0020329 | A1 | 1/2021 | Bae et al. | |
| 2021/0036814 | A1 | 2/2021 | Tsukidate et al. | |
| 2023/0171881 | A1 | 6/2023 | Bae et al. | |

FOREIGN PATENT DOCUMENTS

| | | | |
|---|---|---|---|
| JP | S63149561 | U | 10/1988 |
| JP | 2006216593 | A | 8/2006 |
| JP | 2012209383 | A | 10/2012 |
| JP | 2018112833 | A | 7/2018 |
| KR | 20060033555 | A | 4/2006 |
| KR | 20070005072 | A | 1/2007 |
| KR | 101572916 | B1 | 11/2015 |
| KR | 20190101826 | A | 9/2019 |
| KR | 20200048238 | A | 5/2020 |
| KR | 20210009972 | A | 1/2021 |
| KR | 20220014162 | A | 2/2022 |
| KR | 220099353 | A | 7/2022 |
| RU | 2506627 | C2 | 2/2014 |
| RU | 2683290 | C2 | 3/2019 |

OTHER PUBLICATIONS

Vietnamese Office Action corresponding to Application No. 1-2023-05204; Dated Sep. 5, 2025.
Russian Office Action corresponding to Application No. 2023120381/07; Dated Feb. 1, 2024.
Australian Office Action corresponding to Application No. 2021425425; Dated May 29, 2024.
Extended European Search Report corresponding to Application No. 21924980.2; Dated May 22, 2024.
Indian Office Action corresponding to Application No. 202337052219, Dated Nov. 6, 2024.
Korean Office Action corresponding to Application No. 10-2021-0016335; Mailing date Nov. 19, 2024.
Indonesia Office Action, Application No. P00202307073, mailed May 15, 2025, 6 pages, with English Translation.
Korean Office Action, Application No. 10-2021-0016335, mailed Jul. 7, 2025; 9 pages, with English Translation.
Brazilian Office Action for Brazilian Application No. BR112023015710-2; Report Mail Date Feb. 12, 2026 (6 Pages; with English Translation).
Chinese Office Action issued for Chinese Application No. 202180093119.6; Report Mail Date Apr. 16, 2026 (16 Pages; with English Translation).
European Office Action for European Application No. 21924980.2-1218; Report Mail Date Mar. 6, 2026 (6 Pages).
Malaysian Office Action issued in Malaysian Patent Application No. PI 2023-004684. Report mailed May 19, 2026; 5 pages.
Singapore Office Action issued in Singapore Application No. 11202305862R. Report mailed Jul. 5, 2026; 8 pages.
Chinese Notice of Allowance for Chinese Application No. 202180093119.6; Mailing Date Aug. 28, 2026 (8 Pages; with English Translation).

* cited by examiner

FLEXIBLE CIRCUIT BOARD AND FOLDABLE ELECTRONIC DEVICE COMPRISING SAME

CROSS-REFERENCE TO RELATED APPLICATION(S)

This application is a continuation application, claiming priority under § 365(c), of International Application No. PCT/KR2021/018297, filed on Dec. 3, 2021, which is based on and claims the benefit of Korean patent application number 10-2021-0016335 filed on Feb. 4, 2021, in the Korean Intellectual Property Office, the disclosures of which are incorporated by reference herein in their entireties.

TECHNICAL FIELD

Various embodiments of the disclosure relate to a flexible printed circuit board and a foldable electronic device including the same.

BACKGROUND ART

Electronic device manufacturers have been pursuing devices having a thin thickness, light weight, miniaturization, and multi-functionality, and for this, the electronic device may include a printed circuit board (e.g., printed circuit board (PCB), printed board assembly (PBA), rigid-flexible PCB (RFPCB), flexible printed circuit board (FPCB), and/or flexible RF cable (FRC)) on which various parts are mounted.

Recently, a foldable electronic device or a slidable electronic device, which is capable of expanding a display, has been developed. The foldable electronic device is configured so that a flexible display (e.g., display module 160 of FIG. 1 or display 200 of FIG. 2A) can be folded or unfolded, and the slidable electronic device is configured so that the flexible display (e.g., display module 160 of FIG. 1 or display 200 of FIG. 2A) can move in a sliding manner to expand or contract a screen.

The above information is provided only as background information to help understanding of the contents of the disclosure. A decision has not yet been made and no claim has been made regarding which one of the above contents can be applied as the related art in relation to the disclosure.

DISCLOSURE OF INVENTION

Technical Problem

During folding of the foldable electronic device, a flexible printed circuit board (e.g., FRC) is folded or unfolded in a folding area where the display is folded, and repeated folding and unfolding of the flexible printed circuit board may cause a problem of damaging the flexible printed circuit board. During slide opening of the slidable electronic device, the screen is expanded, whereas during slide closing thereof, the screen may be reduced. During expansion and reduction of the screen of the slidable electronic device, the flexible printed circuit board (e.g., FRC) is folded and unfolded in a hinge structure area, and repeated folding and unfolding of the flexible printed circuit board may cause a problem of damaging the flexible printed circuit board.

Solution to Problem

During folding of a foldable electronic device, a flexible printed circuit board (e.g., FRC) may be folded or unfolded in a folding area where a display is folded. The technical subject matter of embodiments of the disclosure is to provide a flexible printed circuit board and a foldable electronic device, which are not damaged even after repeated folding and unfolding thereof.

The technical subject matter of embodiments of the disclosure is to provide a flexible printed circuit board and a foldable electronic device, which can prevent an impedance mismatch of an RF signal that is transmitted through the flexible printed circuit board by preventing an interference of an electric field by metal utensils of the electronic device during repeated folding and unfolding (e.g., opening and closing) of the flexible printed circuit board.

The technical subject matters to be achieved by the disclosure are not limited to those as described above, and other unmentioned technical subject matters will be able to be understood by those of ordinary skill in the art to which the disclosure pertains from the following description.

Additional aspects will be partially described in the following description, will be partially clear from the description, or will be understood through execution of presented embodiments.

An electronic device according to the disclosure may include: a hinge structure; a flexible display configured to be folded or unfolded by the hinge structure; a first part and a second part coupled to the hinge structure, the first part and the second part configured to approach each other to face each other when being folded by the hinge structure and configured to be spaced apart from each other when being unfolded by the hinge structure; a first printed circuit board disposed on the first part; a second printed circuit board disposed on the second part; and a flexible printed circuit board configured to electrically connect the first printed circuit board and the second printed circuit board to each other. The flexible printed circuit board may include a first area configured to be bent in response to a folding or an unfolding (e.g., a shape transformation) of the electronic device, and a second area positioned around the first area that does not bend. The first area may include a single main signal wiring layer. The second area may include a plurality of signal wiring layers. The first area and the second area may be formed with different thicknesses.

A flexible printed circuit board of a foldable electronic device according to the disclosure may include: a first part configured to be bent in response to a folding or an unfolding of the electronic device; and a second part positioned around the first part that does not bend. The first part may include a single main signal wiring layer. The second part may include a plurality of signal wiring layers. The first part and the second part may be formed with different thicknesses.

Advantageous Effects of Invention

The flexible printed circuit board according to various embodiments of the disclosure is not damaged even after repeated folding and unfolding (e.g., opening and closing) in the folding area where the display is folded.

The flexible printed circuit board according to various embodiments of the disclosure has protection layers disposed on upper and lower parts of the main signal wiring layer of the first part (e.g., bending part), and thus can prevent the interference of the electric field by the metal utensils of the electronic device during the repeated folding and unfolding (e.g., opening and closing). Through this, an impedance mismatch of the RF signal being transmitted through the flexible printed circuit board can be prevented, and thus an improved signal transmission performance can be obtained.

Advantageously, because the foldable electronic device according to various embodiments of the disclosure is not damaged even after the flexible printed circuit board is repeatedly folded and unfolded in the folding area where the display is folded, the lifespan of the electronic device can be extended, and reliability of the device can be heightened.

In addition, various effects being grasped directly or indirectly through this document can be provided.

Other aspects, advantages, and prominent features of the disclosure will be apparent to those of skilled in the art from the following detailed description that discloses various embodiments of the disclosure taken along the accompanying drawings.

BRIEF DESCRIPTION OF DRAWINGS

In relation to the description of drawings, the same or similar reference numerals may be used for the same or similar constituent elements.

It is to be noted that the same reference numerals are used to depict the same or similar elements, features, and structures throughout the drawings.

MODE FOR THE INVENTION

The following description with reference to the accompanying drawings is provided to help comprehensive understanding of various embodiments of the disclosed contents as defined in the claims and equivalents thereof. Here, although various specific details are included to help the understanding, this should be considered as being merely exemplary. Accordingly, those of ordinary skill in the art to which the disclosure pertains will perceive that various modifications and corrections of various embodiments disclosed in the description can be made without departing from the scope and idea of the disclosed contents. Further, for clarity and brevity, description of the well-known functions and constitutions may be omitted.

The terms and words used in the following description and the claims are not limited to the meanings in the literature, and are just used by the inventor to make clear and consistent understanding of the disclosure possible. Accordingly, it should be clear to those of skilled in the art that the following description of various embodiments of the disclosure is not to limit the disclosure as defined by the appended claims and equivalents thereof, but is provided for the purpose of examples only.

It should be understood that unless clearly indicated otherwise on context, a singular form includes plural indication targets. Accordingly, for example, the mention on a "constituent element surface" may include the mention on one or more of such surfaces.

Figure 1:
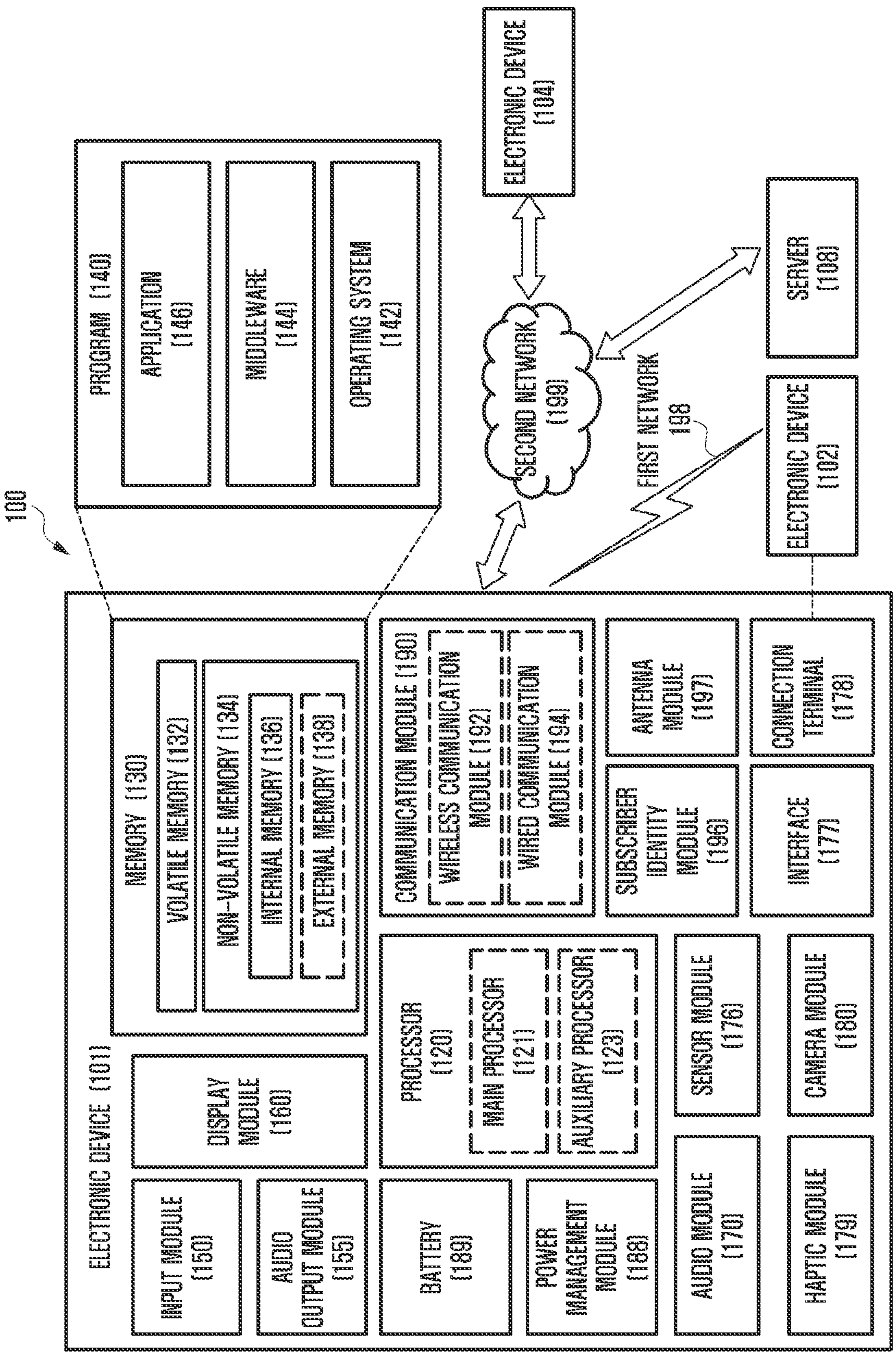
FIG. 1 is a block diagram of an electronic device in a network environment according to various embodiments of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, the display module 160 illustrated in FIG. 1 may include a display configured to be folded or unfolded. During folding of a foldable electronic device including the display, a flexible printed circuit board (e.g., FRC) may be folded and unfolded in a folding area where the display is folded.

According to an embodiment, the display module 160 illustrated in FIG. 1 may include the display slidably disposed and providing a screen (e.g., display screen).

For example, the display area of the electronic device 101 is an area visually exposed and enabling an image to be output, and the electronic device 101 may adjust the display area in accordance with movement of a sliding plate (not illustrated) or movement of the display. In such an example of a rollable electronic device which includes the display module 160, and is configured to promote selective expansion of the display area, at least a part (e.g., housing) of the electronic device 101 may slidably operate at least partly. For example, the display module 160 may be referred to as a slide-out display or an expandable display.

FIGS. 2A to 2F are various views illustrating a flat (e.g., opening) state of an electronic device 101 according to various embodiments of the disclosure. FIGS. 3A to 3F are various views illustrating a folded (e.g., closing) state of an electronic device 101 according to various embodiments of the disclosure.

With reference to FIGS. 2A to 3F, the electronic device 101 may include a foldable housing 300, a hinge cover 330 configured to cover a foldable part of the foldable housing 300, and a flexible or foldable display 200 (hereinafter, "display" 200 in short) disposed in a space formed by the foldable housing 300. In this document, a surface on which the display 200 is disposed is defined as a first surface or a front surface of the electronic device 101 (refer to FIG. 2A). Further, a surface opposite to the front surface is defined as a second surface or a rear surface of the electronic device 101 (refer to FIG. 2F). Further, a surface surrounding a space between the front surface and the rear surface is defined as a third surface or a side surface of the electronic device 101 (refer to FIGS. 2D and 2E). For example, the electronic device 101 may be folded or unfolded in an X-axis direction based on a folding area 203.

In an embodiment, the foldable housing 300 may include a first housing structure 310, a second housing structure 320 including a sensor area 324, a first rear cover 380, and a second rear cover 390. The foldable housing 300 of the electronic device 101 is not limited to the shape and combination illustrated in FIGS. 2A to 3F, and may be implemented by an association and/or combination of other shapes or components. For example, in another embodiment, the first housing structure 310 and the first rear cover 380 may be integrally formed with each other, and the second housing structure 320 and the second rear cover 390 may be integrally formed with each other.

In the illustrated embodiment, the first housing structure 310 and the second housing structure 320 may be disposed on both sides around a folding axis A, and may have a shape in overall symmetry with respect to the folding axis A. As described later, the first housing structure 310 and the second housing structure 320 may have different angles or distances depending on whether the electronic device 101 is in a flat state, a folded state, or an intermediate state. In the illustrated embodiment, unlike the first housing structure 310, the second housing structure 320 may additionally include the sensor area 324 in which various sensors are disposed, but in other areas, the second housing structure 320 may have a mutually symmetrical shape with the first housing structure 310.

In an embodiment, the first housing structure 310 and the second housing structure 320 may form a recess for accommodating the display 200 together. In the illustrated embodiment, due to the sensor area 324, the recess may have two or more different widths in a vertical direction to the folding axis A.

For example, the recess may have a first width W1 between a first part 310*a* of the first housing structure 310 and a first part 320*a* of the second housing structure 320 formed at the periphery of the sensor area 324 of the second housing structure 320. The recess may have a second width W2 formed by a second part 310*b* of the first housing structure 310 that is in parallel to the folding axis A on the first housing structure 310 and a second part 320*b* of the second housing structure 320 that is in parallel to the folding axis A, while not corresponding to the sensor area 324 of the second housing structure 320. In this case, the second width W2 may be set to be longer that the first width W1. In other words, the first part 310*a* of the first housing structure 310 and the first part 320*a* of the second housing structure 320, which have a mutually asymmetric shape, may form the first width W1 of the recess. The second part 310*b* of the first housing structure 310 and the second part 320*b* of the second housing structure 320, which has a mutually symmetric shape, may form the second width W2. In an embodiment, the first part 320*a* and the second part 320*b* of the second housing structure 320 may have different distances from the folding axis A. The width of the recess is not limited to the illustrated example. In various embodiments, the recess may have a plurality of widths by the shape of the sensor area 324 or the part having the asymmetric shape of the first housing structure 310 and the second housing structure 320.

In an embodiment, at least parts of the first housing structure 310 and the second housing structure 320 may be formed of a metal material or a non-metal material having a stiffness level selected to support the display 200.

In an embodiment, the sensor area 324 may be formed to have a certain area, being adjacent to one corner of the second housing structure 320. However, the disposition, shape, and size of the sensor area 324 are not limited to the illustrated examples. For example, in another embodiment, the sensor area 324 may be provided at another corner of the second housing structure 320 or in a certain area between an upper end corner and a lower end corner. In an embodiment, components for performing various functions embedded in the electronic device 101 may be exposed to the front surface of the electronic device 101 through the sensor area 324 or through one or more openings provided in the sensor area 324. In various embodiments, the above components may include various kinds of sensors. For example, the sensors may include at least one of a front camera, a receiver, or a proximity sensor.

The first rear cover 380 may be disposed on one side of the folding axis A on the rear surface of the electronic device, and may have, for example, a substantially rectangular periphery, and the periphery may be surrounded by the first housing structure 310. Similarly, the second rear cover 390 may be disposed on the other side of the folding axis A on the rear surface of the electronic device, and the periphery thereof may be surrounded by the second housing structure 320.

In the illustrated embodiment, the first rear cover 380 and the second rear cover 390 may have a substantially symmetric shape around the folding axis A. However, the first rear cover 380 and the second rear cover 390 do not necessarily have the mutually symmetric shape, and in another embodiment, the electronic device 101 may have various shapes of the first rear cover 380 and the second rear cover 390. Further, in still another embodiment, the first rear cover 380 may be integrally formed with the first housing structure 310, and the second rear cover 390 may be integrally formed with the second housing structure 320.

In an embodiment, the first rear cover 380, the second rear cover 390, the first housing structure 310, and the second housing structure 320 may form a space in which various components (e.g., printed circuit board or battery) of the electronic device 101 can be disposed. In an embodiment, on the rear surface of the electronic device 101, one or more components may be disposed, or visually exposed. For example, at least a part of a sub-display 290 may be visually exposed through a first rear area 382 of the first rear cover 380. In another embodiment, one or more components or sensors may be visually exposed through a second rear area 392 of the second rear cover 390. In various embodiments, the sensors may include a proximity sensor and/or a rear camera.

The hinge cover 330 may be disposed between the first housing structure 310 and the second housing structure 320, and may be configured to hide an inner component (e.g., hinge structure). In an embodiment, the hinge cover 330 may be hidden by parts of the first housing structure 310 and the second housing structure 320 or may be exposed to outside in accordance with a state (flat (unfolded) state or folded state) of the electronic device 101.

Figure 2A:
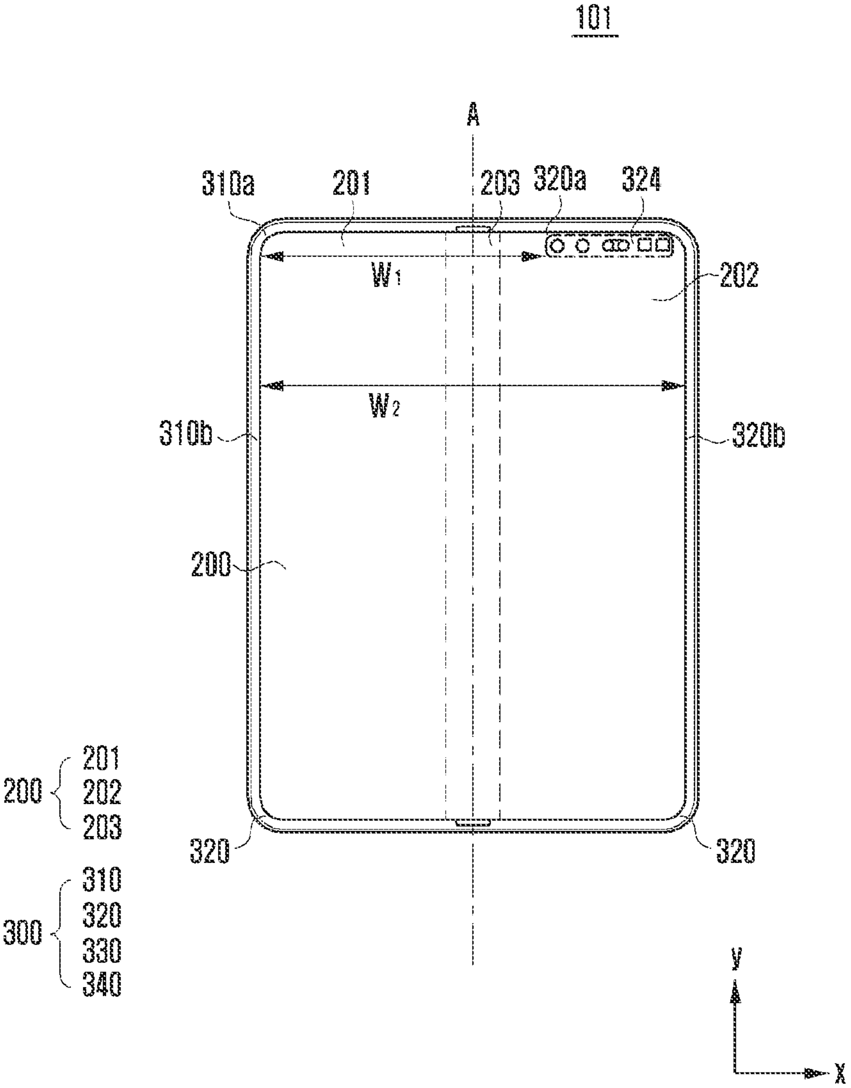
FIG. 2A is a front view illustrating a flat (e.g., opening) state of an electronic device according to various embodiments of the disclosure.
Figure 2B:
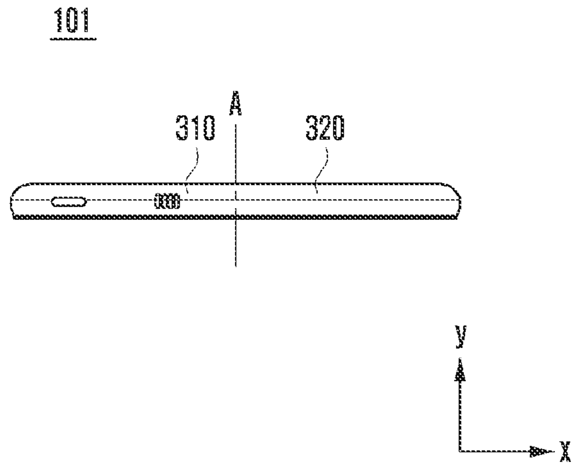
FIG. 2B is a top view illustrating a flat (e.g., opening) state of an electronic device according to various embodiments of the disclosure.
Figure 2C:
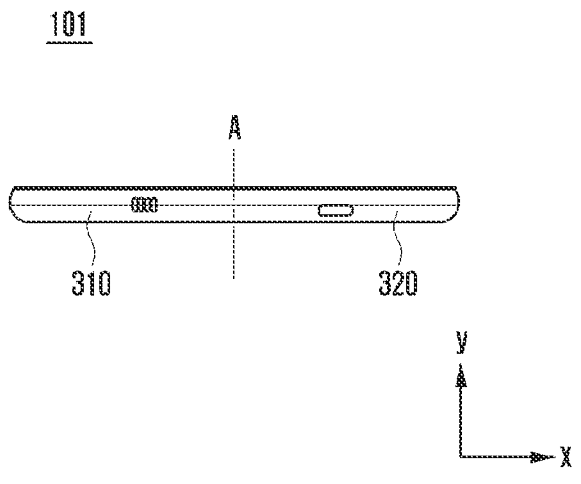
FIG. 2C is a bottom view illustrating a flat (e.g., opening) state of an electronic device according to various embodiments of the disclosure.
Figure 2D:
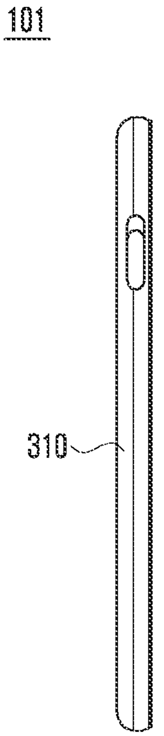
FIG. 2D is a left side view illustrating a flat (e.g., opening) state of an electronic device according to various embodiments of the disclosure.
Figure 2E:
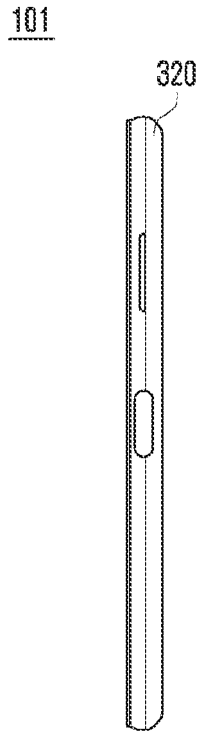
FIG. 2E is a right side view illustrating a flat (e.g., opening) state of an electronic device according to various embodiments of the disclosure.
Figure 2F:
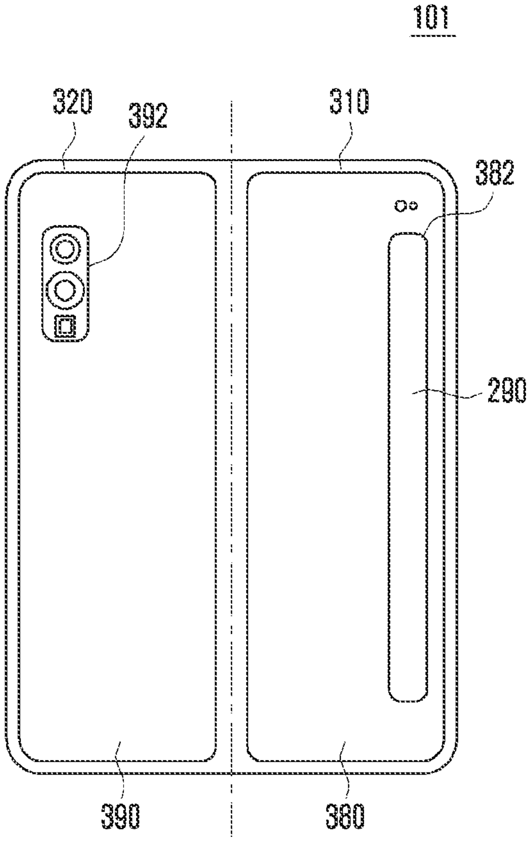
FIG. 2F is a rear view illustrating a flat (e.g., opening) state of an electronic device according to various embodiments of the disclosure.
Figure 3A:
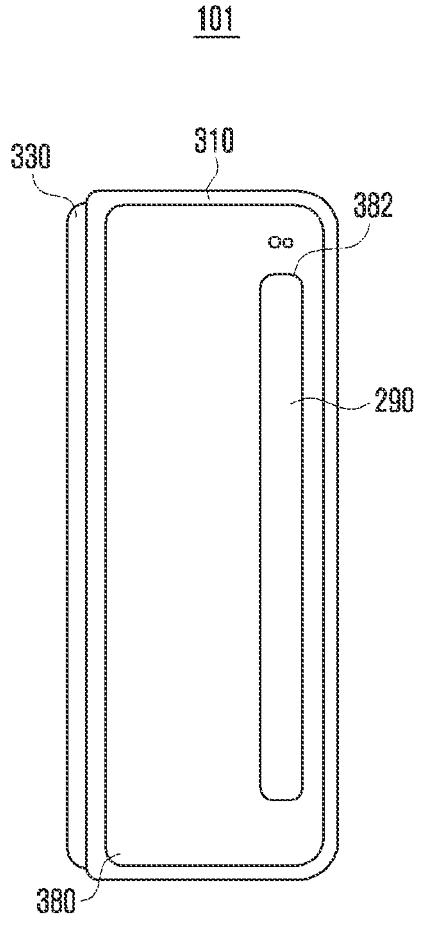
FIG. 3A is a front view illustrating a folded (e.g., closing) state of an electronic device according to various embodiments of the disclosure.
Figure 3B:
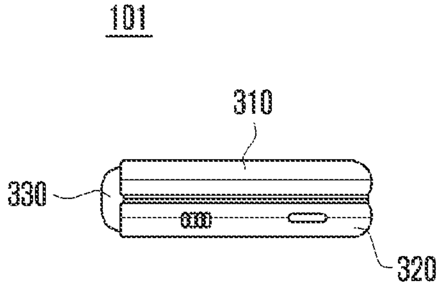
FIG. 3B is a top view illustrating a folded (e.g., closing) state of an electronic device according to various embodiments of the disclosure.
Figure 3C:
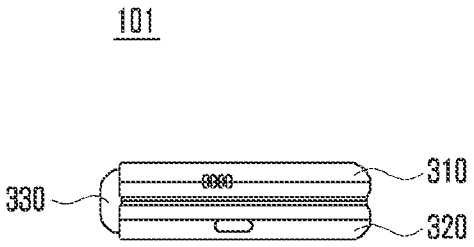
FIG. 3C is a bottom view illustrating a folded (e.g., closing) state of an electronic device according to various embodiments of the disclosure.
Figure 3D:
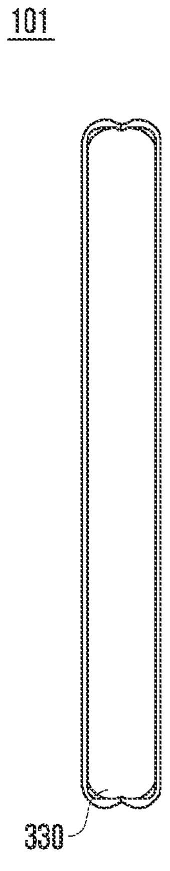
FIG. 3D is a left side view illustrating a folded (e.g., closing) state of an electronic device according to various embodiments of the disclosure.
Figure 3E:
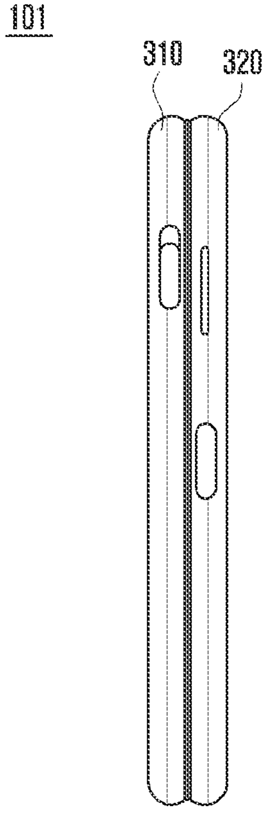
FIG. 3E is a right side view illustrating a folded (e.g., closing) state of an electronic device according to various embodiments of the disclosure.
Figure 3F:
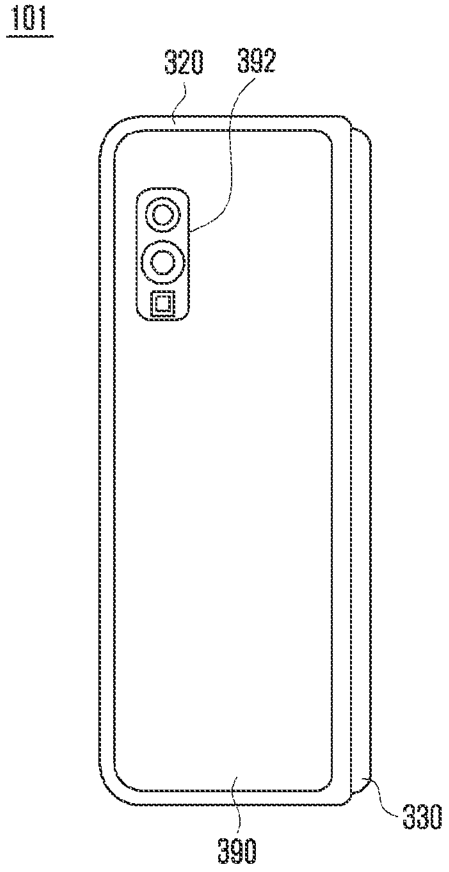
FIG. 3F is a rear view illustrating a folded (e.g., closing) state of an electronic device according to various embodiments of the disclosure.

As an example, as illustrated in FIG. 2A, when the electronic device 101 is in the flat state, the hinge cover 330 may not be exposed by being hidden by the first housing structure 310 and the second housing structure 320. As an example, as illustrated in FIG. 3A, when the electronic device 101 is in the folded state (e.g., fully folded state), the hinge cover 330 may be exposed to the outside between the first housing structure 310 and the second housing structure 320. As an example, in the intermediate state where the first housing structure 310 and the second housing structure 320 form (are folded with) a certain angle, the hinge cover 330 may be partially exposed to the outside between the first housing structure 310 and the second housing structure 320. However, in this case, the exposed area may be smaller than that in the fully folded state). In an embodiment, the hinge cover 330 may include a curved surface.

The display 200 may be disposed in a space formed by the foldable housing 300. For example, the display 200 may be seated in the recess formed by the foldable housing 300, and may configure most of the front surface of the electronic device 101.

Accordingly, the front surface of the electronic device 101 may include the display 200, a partial area of the first housing structure 310 adjacent to the display 200, and a partial area of the second housing structure 320. Further, the rear surface of the electronic device 101 may include the first rear cover 380, a partial area of the first housing structure 310 adjacent to the first rear cover 380, the second rear cover 390, and a partial area of the second housing structure 320 adjacent to the second rear cover 390.

The display 200 may mean a display of which at least a partial area can be transformed into a plane or a curved surface. In an embodiment, the display 200 may include the folding area 203, a first area 201 disposed on one side (left side of the folding area 203 illustrated in FIG. 2A) based on the folding area 203, and a second area 202 disposed in the other side (right side of the folding area 203 illustrated in FIG. 2A). The display 200 may include a polarizing film (or polarizing layer), a window glass (e.g., ultrathin tempered glass or polymer window), and an optical compensation film (OCF).

The area division of the display 200 is exemplary, and the display 200 may be divided into a plurality (e.g., 4 or more or 2) of areas in accordance with the structure or function thereof. As an example, in an embodiment illustrated in FIG. 2A, the area of the display 200 may be divided by the folding area 203 or the folding axis A extending in parallel to the y axis, whereas in another embodiment, the area of the display 200 may be divided into the areas based on another folding area (e.g., folding area in parallel to the x axis) or another folding axis (e.g., folding axis in parallel to the x axis).

The first area 201 and the second area 202 may have a symmetric shape as a whole around the folding area 203. However, unlike the first area 201, the second area 202 may include a cut notch depending on the existence of the sensor area 324, but in other areas, the second area 202 may have a symmetric shape with the first area 201. In other words, the first area 201 and the second area 202 may include portions having symmetric shapes and portions having asymmetric shapes with each other.

Hereinafter, operations of the first housing structure 310 and the second housing structure 320 and respective areas of the display 200 in accordance with the states (e.g., flat state and folded state) of the electronic device 101 will be described.

In an embodiment, when the electronic device 101 is in the flat state (e.g., FIG. 2A), the first housing structure 310 and the second housing structure 320 may be disposed to be directed in the same direction at an angle of 180 degrees. The surface of the first area 201 of the display 200 and the surface of the second are 202 may form an angle of 180 degrees with each other, and may be directed in the same direction (e.g., front surface direction of the electronic device). The folding area 203 may form the same plane with the first area 201 and the second area 202.

In an embodiment, when the electronic device 101 is in the folded state (e.g., FIG. 3A), the first housing structure 310 and the second housing structure 320 may be disposed to face each other. The surface of the first area 201 of the display 200 and the surface of the second area 202 may form a narrow angle (e.g., 0 to 10 degrees) with each other, and may face each other. At least a part of the folding area 203 may form a curved surface having a certain curvature.

In an embodiment, when the electronic device 101 is in a half-folded state, the first housing structure 310 and the second housing structure 320 may be disposed to form a certain angle with each other. The surface of the first area 201 of the display 200 and the surface of the second area 202 may form an angle, which is larger than that in the folded state and smaller than that in the flat state, with each other. At least a part of the folding area 203 may form a curved surface having a certain curvature, and in this case, the curvature may be smaller than that in the folded state.

Figure 4:
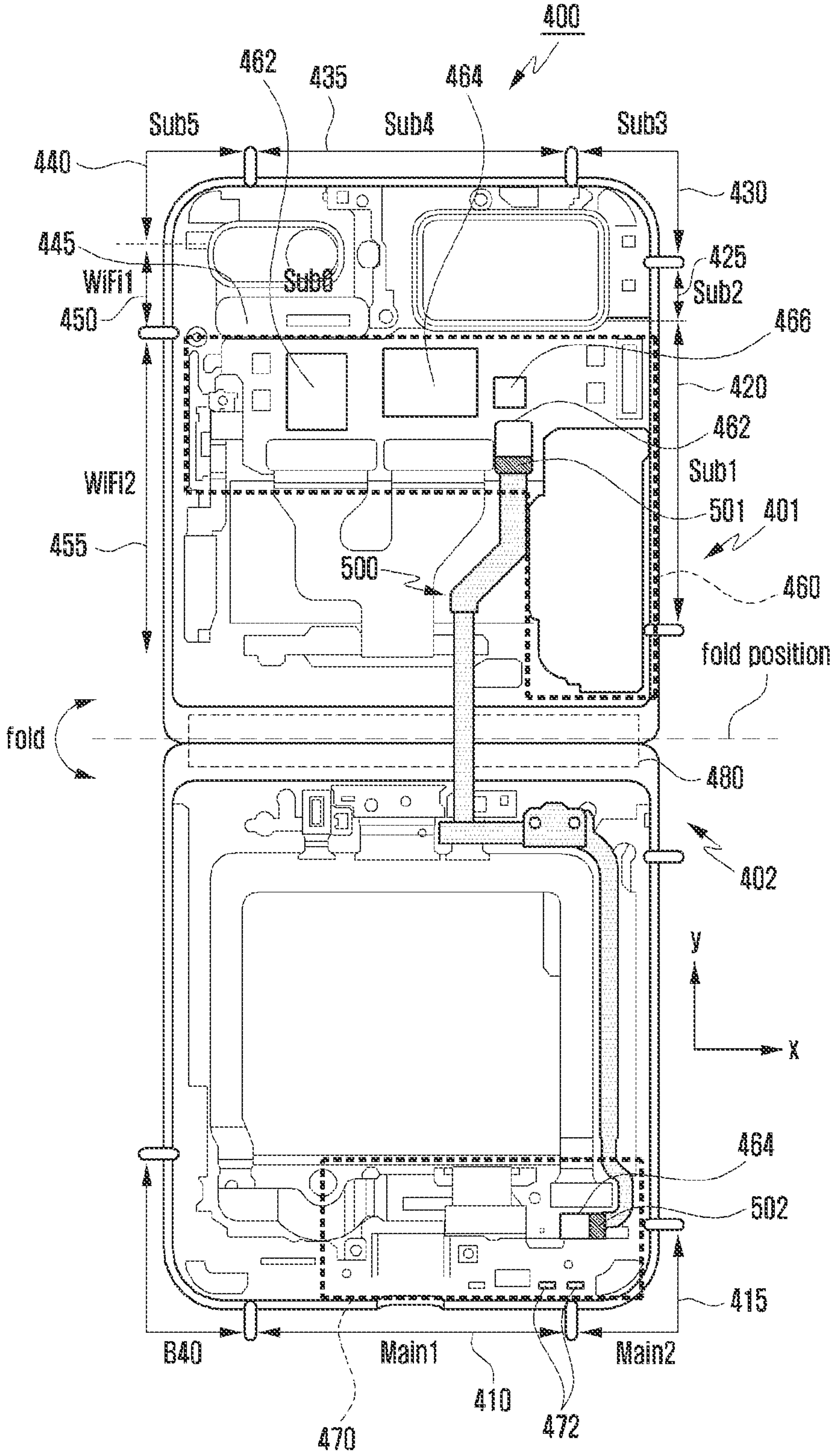
FIG. 4 is a view illustrating an electronic device according to various embodiments of the disclosure.

FIG. 4 is a view illustrating an electronic device 400 (e.g., electronic device 101 of FIG. 2A) according to various embodiments of the disclosure.

With reference to FIG. 4, an electronic device 400 (e.g., electronic device 101 of FIG. 2A) according to various embodiments of the disclosure may be a foldable device. The electronic device 400 may include a hinge structure 480 being disposed in a fold position. For example, the electronic device 400 may be folded or unfolded in the y-axis direction based on the fold position by using the hinge structure 480. When the electronic device 400 (e.g., electronic device 101 of FIG. 2A) is folded, a first part 401 and a second part 402 of the electronic device 400 (e.g., electronic device 101 of FIG. 2A) may approach each other to face each other based on the fold position.

According to an embodiment, the electronic device 400 may include the first part 401, the second part 402, a first printed circuit board 460 disposed on the first part 401, a second printed circuit board 470 disposed on the second part 402, a plurality of antenna modules, and a flexible printed circuit board 500 (e.g., flexible RF cable (foldable FRC). On the first printed circuit board 460, a modem 466, a transceiver 462, and a plurality of frontend module 464. On the second printed circuit board 470, an antenna feeding part 472 connected to at least one antenna module may be disposed. The flexible printed circuit board 500 may electrically connect the first printed circuit board 460 of the first part 401 and the second printed circuit board 470 of the second part 402 to each other.

The plurality of antenna modules may include a first antenna module 410 (e.g., first main antenna module), a second antenna module 415 (e.g., second main antenna module), a third antenna module 420 (e.g., sub-1 antenna module), a fourth antenna module 425 (e.g., sub-2 antenna module), a fifth antenna module 430 (e.g., sub-3 antenna module), a sixth antenna module 435 (e.g., sub-4 antenna module), a seventh antenna module 440 (e.g., sub-5 antenna module), an eighth antenna module 445 (e.g., sub-6 antenna module), a first WiFi antenna module 450, and a second WiFi antenna module 455. According to an embodiment, although a WiFi circuit supporting WiFi communication is exemplified as the WiFi antenna module, the WiFi antenna module is not limited thereto. For example, a Bluetooth circuit supporting Bluetooth communication may be included.

Figure 5:
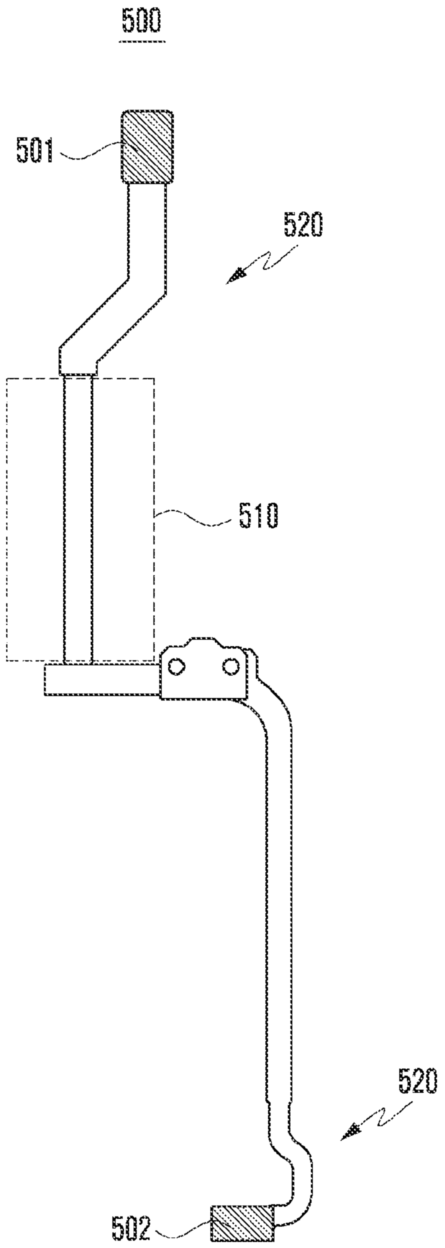
FIG. 5 is a view illustrating a flexible printed circuit board (e.g., flexible RF cable (foldable FRC) according to various embodiments of the disclosure.

FIG. 5 is a view illustrating a flexible printed circuit board 500 (e.g., flexible RF cable (foldable FRC) according to various embodiments of the disclosure.

With reference to FIGS. 4 and 5, a flexible printed circuit board 500 (e.g., foldable FRC) may include a first connector 501, a second connector 502, and wiring parts 510 and 520. The wiring parts 510 and 520 may include a first part 510 (e.g., bending part) being bent by the folding and unfolding of the electronic device (e.g., electronic device 101 of FIG. 2A or electronic device 400 of FIG. 4), and a second part 520 (e.g., non-binding part) that remains unbent when folding and unfolding the electronic device. As an example, the first part 510 (e.g., bent part) of the flexible printed circuit board 500 (e.g., foldable FRC) may be formed to correspond to the fold position of the electronic device (e.g., electronic device 101 of FIG. 2A or electronic device 400 of FIG. 4).

As an example, when the electronic device 400 is in the folded state (folded state 1310 of FIGS. 13A to 13D), the first part 401 and the second part 402 may approach or come in contact with each other based on the fold position. In order to prevent the damage or disconnection of the flexible printed circuit board 500 in a folding part (e.g., fold position) of the electronic device 400, the first part 510 of the flexible printed circuit board 500 may be disposed in the folding part (e.g., fold position) of the electronic device 400. That is, the first part 510 of the flexible printed circuit board 500 may be disposed to at least overlap the hinge structure 480.

Figure 14A:
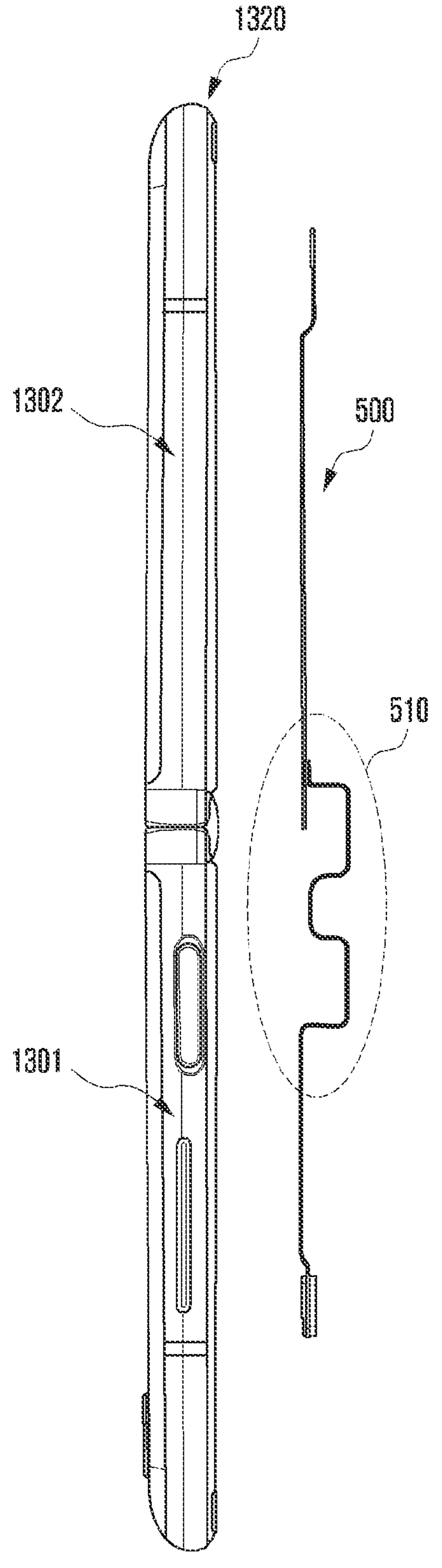
FIGS. 14A, 14B, and 14C are views illustrating shapes of a flexible printed circuit board when a foldable electronic device is in a flat state according to various embodiments of the disclosure.
Figure 14B:
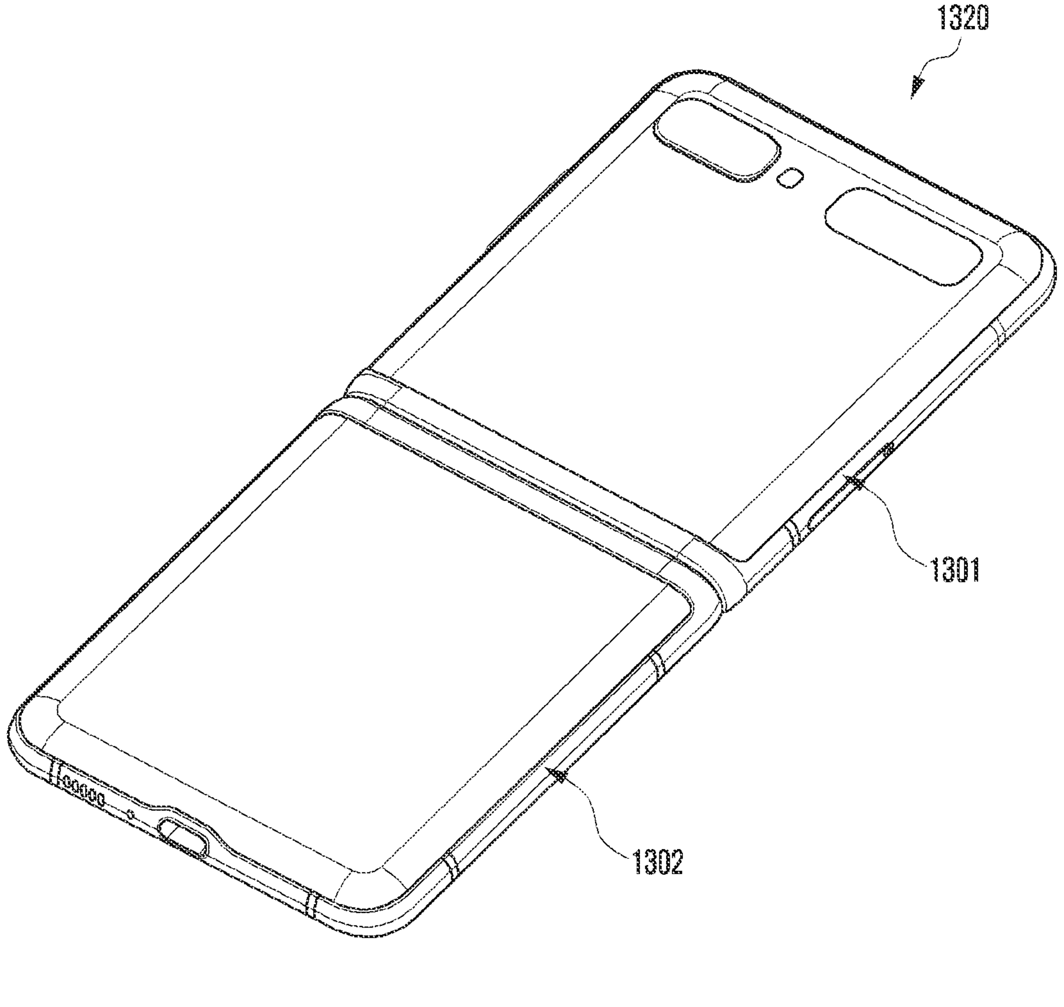
Figure 14C:
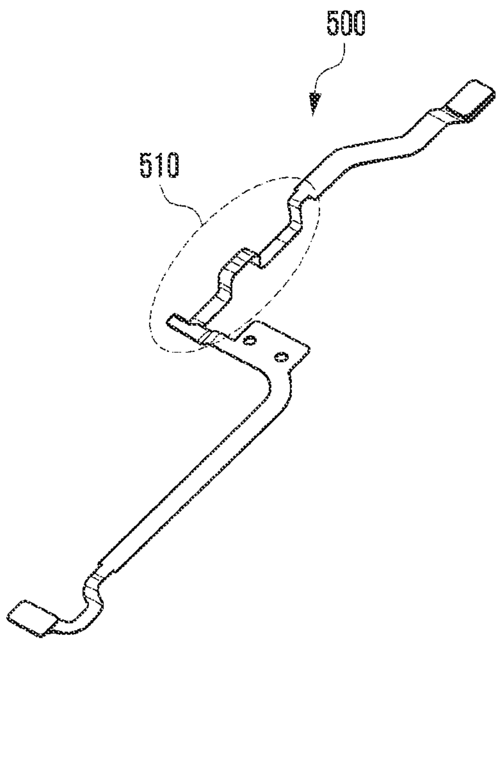

Further, when the electronic device 400 is in the flat state (e.g., flat state 1320 of FIGS. 14A, 14B, and 14C, the first part 401 and the second part 402 may be unfolded and may be spaced apart from each other based on the fold position. In order to prevent the damage or disconnection of the flexible printed circuit board 500 in a part (e.g., fold position) where the flexible printed circuit board 500 is folded and then is unfolded, the first part 510 of the flexible printed circuit board 500 may be disposed in the part (e.g., fold position) where the electronic device 400 is unfolded. That is, the first part 510 of the flexible printed circuit board 500 may be disposed to at least overlap the hinge structure 480.

The flexible printed circuit board 500 (e.g., foldable FRC) may be formed with a thickness of about 30 to 100 m, for example 50 m. Here, the first part 510 (e.g., bent part) and the second part 520 (e.g., non-bent part) may be formed to have different thicknesses (refer to FIG. 5). As an example, the first part 510 (e.g., bent part) may be formed with a thickness of about 50 to 60 m. The first part 510 (e.g., bent part) may be formed with one or more layers having a thickness of about 60 m or less. As an example, the second part 520 (e.g., non-bent part) may be formed with a thickness of more than 60 m, for example about 70 m. Since the second part 520 (e.g., non-bent part) is laminated as one or more layers, there are no thickness restrictions.

According to an embodiment, on a first side of the flexible printed circuit board 500 (e.g., foldable FRC), the first connector 501 connected to the transceiver 462 of the first printed circuit board may be formed. On a second side of the flexible printed circuit board 500 (e.g., foldable FRC), the second connector 502 connected to the transceiver 462 of the second printed circuit board may be formed. The first printed circuit board of the first part 401 and the second printed circuit board of the second part 402 may be electrically connected to each other by the flexible printed circuit board 500 (e.g., foldable FRC). Transmission/reception of a control signal and an RF signal may be performed between the first part 401 and the second part 402 by the flexible printed circuit board 500 (e.g., foldable FRC).

Figure 6A:
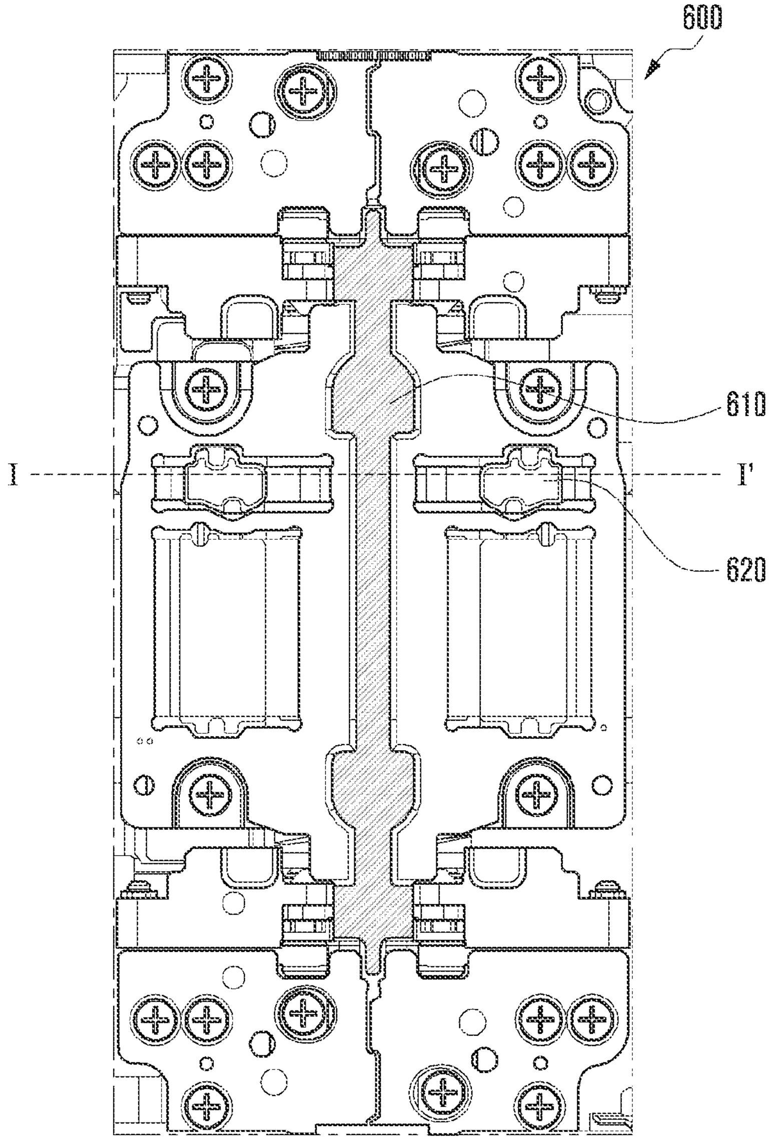
FIG. 6A is a view illustrating an area in which a hinge structure of an electronic device is disposed.
Figure 6B:
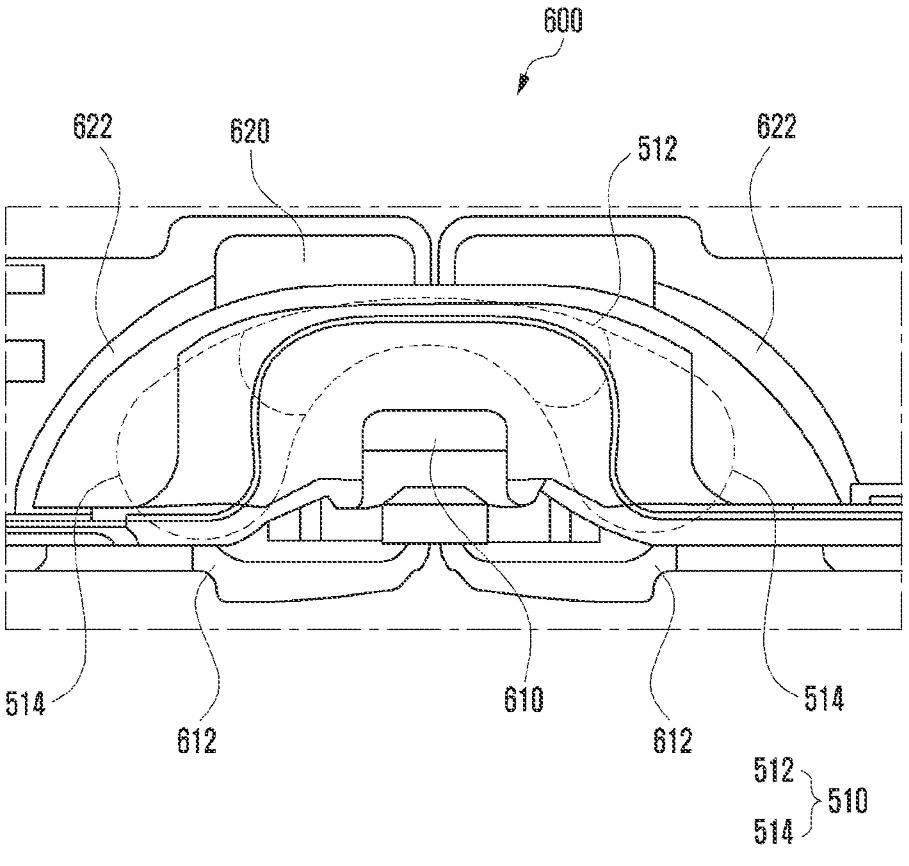
FIG. 6B is a view illustrating an example of a part in which a flexible printed circuit board (e.g., flexible RF cable (foldable FRC)) is bent by unfolding of a hinge structure of a foldable electronic device.
Figure 6C:
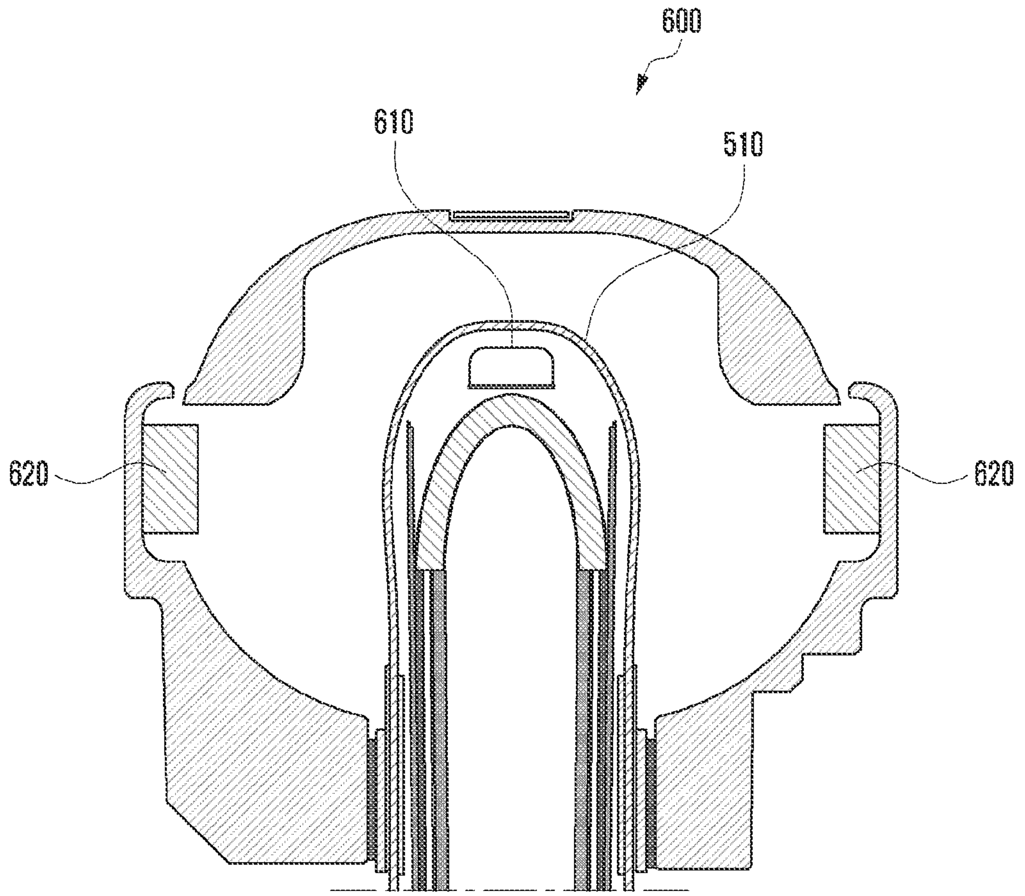
FIG. 6C is a view illustrating an example of a part in which a flexible printed circuit board (e.g., flexible RF cable (foldable FRC)) is bent by folding and unfolding of a hinge structure of a foldable electronic device.

FIG. 6A is a view illustrating an area in which a hinge structure 600 of an electronic device is disposed. FIG. 6B is a view illustrating an example of a part in which a flexible printed circuit board 500 (e.g., flexible RF cable (foldable FRC)) is bent by unfolding of a hinge structure 600 of a foldable electronic device. FIG. 6C is a view illustrating an example of a part in which a flexible printed circuit board 500 (e.g., flexible RF cable (foldable FRC)) is bent by folding and unfolding of a hinge structure 600 of a foldable electronic device.

With reference to FIGS. 6A to 6C, the electronic device (e.g., electronic device 400 of FIG. 4) may be a foldable electronic device that can be folded in the y-axis direction. The electronic device (e.g., electronic device 400 of FIG. 4) may include the hinge structure 600 (e.g., hinge structure 480 of FIG. 4) disposed in the fold position.

For example, the electronic device (e.g., electronic device 400 of FIG. 4) may fold or unfold the first part (e.g., first part 401 of FIG. 4 and the second part (e.g., second part 402 of FIG. 4) in a first direction (e.g., y-axis direction of FIG. 4) based on the fold position by using the hinge structure 600.

According to an embodiment, the flexible printed circuit board 500 (e.g., flexible RF cable (foldable FRC)) disposed on the electronic device 400 may electrically connect the first printed circuit board 460 of the first part (e.g., first part 401 of FIG. 4) and the second printed circuit board (e.g., second printed circuit board 470 of FIG. 4) of the second part (e.g., second part 402 of FIG. 4) to each other. As an example, since the flexible printed circuit board 500 electrically connects the first printed circuit board 460 and the second printed circuit board 470 to each other, it can electrically connect a signal from the modem (e.g., modem 466 of FIG. 4) disposed on the first printed circuit board (e.g., first printed circuit board 460 of FIG. 4) up to an antenna disposed on the second printed circuit board (e.g., second printed circuit board 470 of FIG. 4).

According to an embodiment, the electronic device 400 (e.g., electronic device 101 of FIG. 2A) may be folded or unfolded through the hinge structure 480, and when the electronic device 400 (e.g., electronic device 101 of FIG. 2A) is folded and unfolded, the first part 510 (e.g., bent part) of the flexible printed circuit board 500 may be bent (e.g., folded or unfolded). When the electronic device 400 (e.g., electronic device 101 of FIG. 2A) is folded and unfolded, a plurality of areas 512 and 514 included in the first part 510 may be bent. The remaining parts except the first part 510 (e.g., non-bent parts) may be formed as the second part (e.g., non-bent part) (e.g., second part 520 (e.g., non-bent part) of FIG. 5). As an example, the first area 512 of the plurality of areas 512 and 514 of the first part 510 may be disposed to at least partly overlap a center bar 610 and a metal structure 620 of the hinge structure 600. The second area 514 may be disposed to at least partly overlap a utensil 612 around the center bar 610 and a utensil 622 around the metal structure 620.

Figure 7:
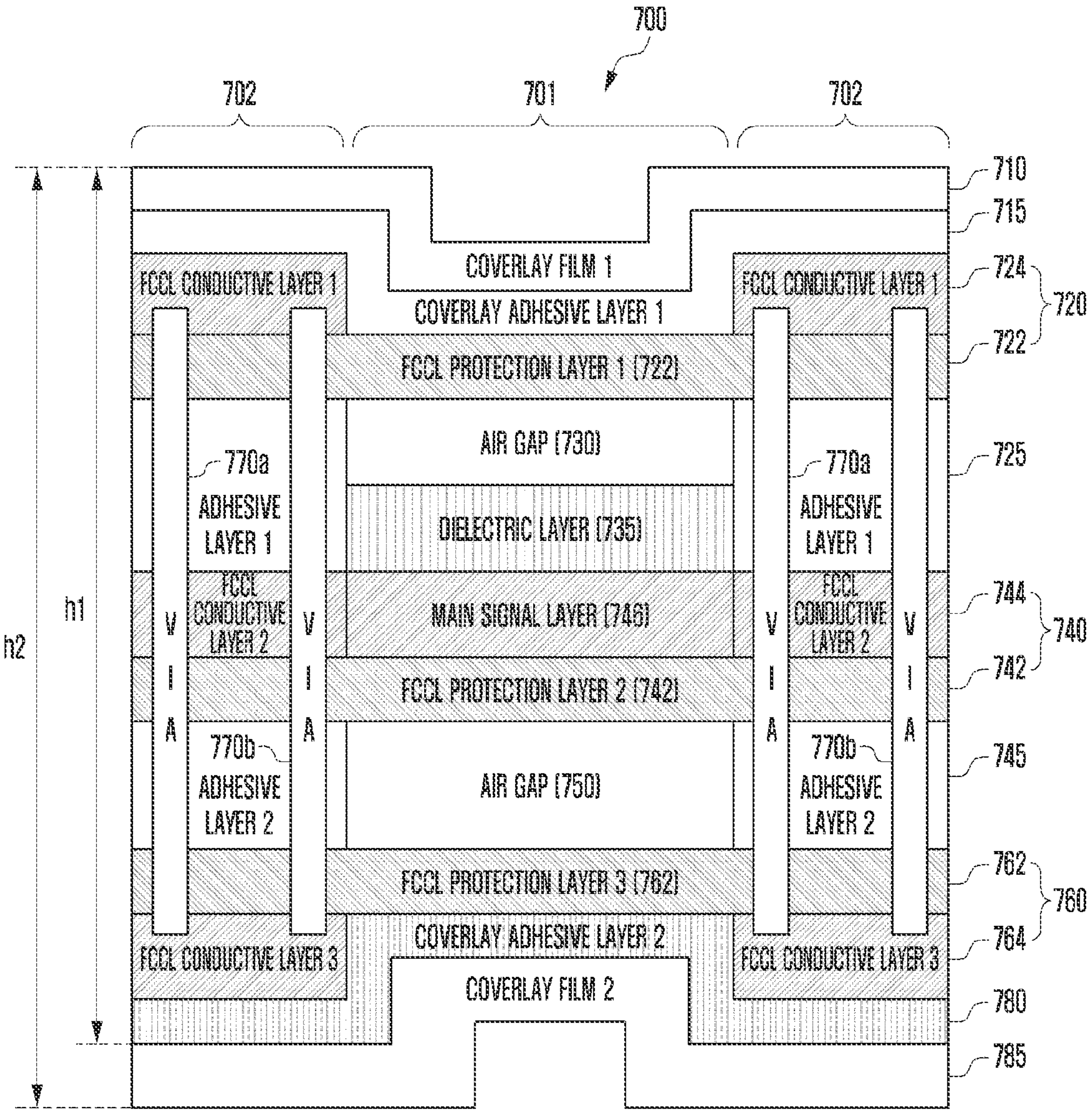
FIG. 7 is a view illustrating a cross-sectional structure of a flexible printed circuit board according to various embodiments of the disclosure.

As an example, in the second part 520 (e.g., second area 702 of FIG. 7), a plurality of signal wiring layers (e.g., a first signal wiring layer 720, a second signal wiring layer 740, and a third signal wiring layer 760 of FIG. 7) may be formed. In the first part 510 (e.g., first area 701 of FIG. 7), a single main signal wiring layer (e.g., main signal wiring layer 746 of FIG. 7) may be formed. Observe that the first area 701 omits the first FCCL conductive layer 724 and the third FCCL conductive layer 764. Accordingly, it is possible to form the first part 510 (e.g., first area 701 of FIG. 7) to be thinner than the second part 520 (e.g., second area 702 of FIG. 7). Here, it is possible to transmit the signal of the electronic device (e.g., electronic device 400 of FIG. 4) through the main signal wiring layer (e.g., main signal wiring layer 746 of FIG. 7). Here, the signal of the electronic device 400 may include RF analog signals of 2G, 3G, 4G, and 5G.

As an example, as illustrated in FIG. 6B, when the electronic device 400 (e.g., electronic device 101 of FIG. 2A) is unfolded through the hinge structure 600, the first part 510 (e.g., bent part) gets far apart from the center bar 610 of the hinge structure 600, and approaches the metal structure 620.

As an example, as illustrated in FIG. 6C, when the electronic device 400 (e.g., electronic device 101 of FIG. 2A) is folded through the hinge structure 600, the first part 510 (e.g., bent part) gets far apart from the metal structure 620 of the hinge structure 600, and approaches the center bar 610.

As described above, when the electronic device 400 (e.g., electronic device 101 of FIG. 2A) is folded and unfolded, the first part 510 (e.g., bent part) of the flexible printed circuit board 500 approaches or gets far apart from the center bar 610 or the metal structure 620, and this may cause an impedance mismatch of the RF signal to occur in the first part 510 (e.g., bent part) of the flexible printed circuit board 500. In order to prevent the impedance mismatch of the RF signal from occurring in the first part 510 (e.g., bent part) of the flexible printed circuit board 500 according to an embodiment of the disclosure, when the electronic device 400 (e.g., electronic device 101 of FIG. 2A) is folded and unfolded, the first part 510 (e.g., bent part) and the second part 520 (e.g., non-bent part) may be formed with different structures.

In order to prevent cracks, disconnection, and fatigue fracture from occurring in the first part 510 (e.g., bent part) of the flexible printed circuit board 500 due to the repeated folding and unfolding of the electronic device 400 (e.g., electronic device 101 of FIG. 2A), the first part 510 (e.g., bent part) and the second part 520 (e.g., non-bent part) may be formed with different thicknesses.

As an example, the first part 510 (e.g., first part 510 of FIG. 5) may be formed to have a first thickness (e.g., about 50 to 60 m). The first part 510 may be formed as one or more layers having the first thickness (e.g., about 60 m or less). The second part 520 (e.g., second part 520 of FIG. 5) may be formed to have a second thickness (e.g., about 70 m) that is thicker than the first thickness. The second part 520 may be formed to have the second thickness, which is thicker than the sum of thicknesses of the entire layers of the first part 510 including the first thickness, and has no restriction on separate thickness. That is, in order to prevent the flexible printed circuit board 500 from being damaged (e.g., cracks, disconnection, fatigue fracture) through the repeated folding of the electronic device 400 (e.g., electronic device 101 of FIG. 2A), the first part 510 (e.g., first part 510 of FIG. 5) may be formed to be thinner than the second part 520 (e.g., second part 520 of FIG. 5).

Figure 8A:
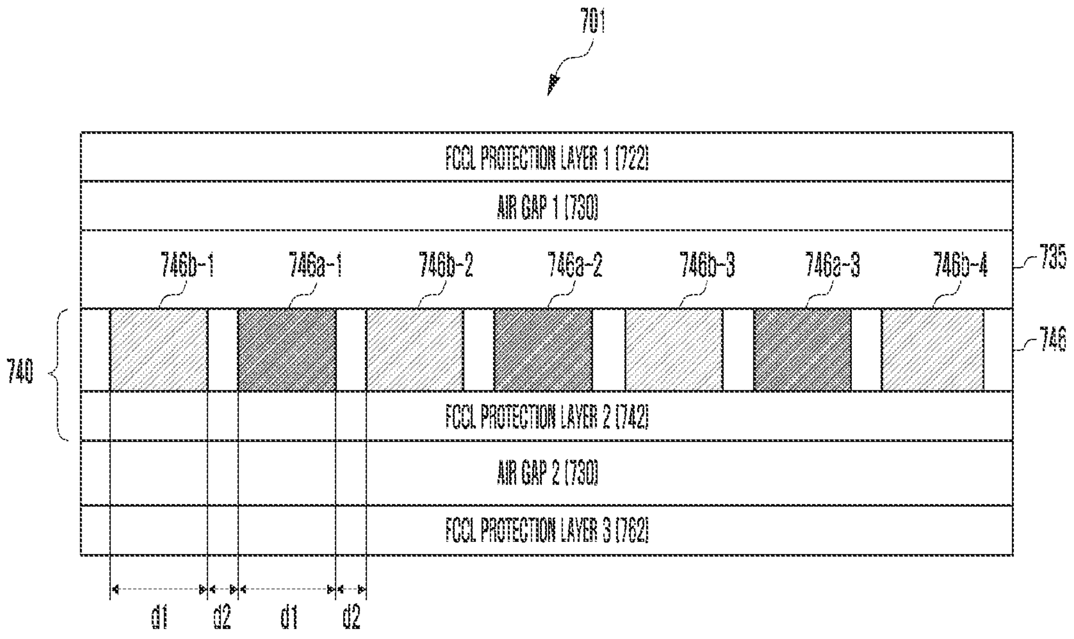
FIG. 8A is a view illustrating a disposition structure of a ground wiring and an RF signal wiring of a first part (e.g., bending part) of a flexible printed circuit board.
Figure 8B:
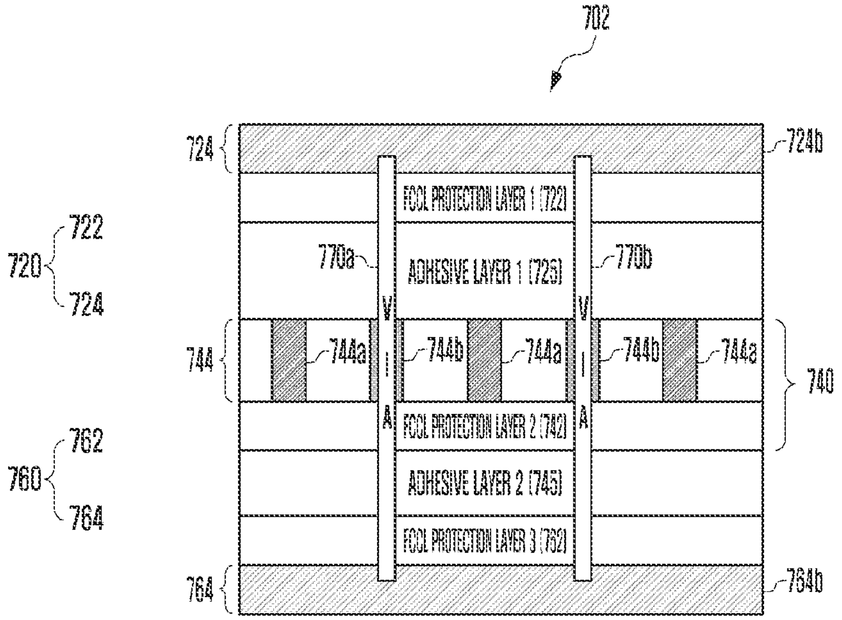
FIG. 8B is a view illustrating a disposition structure of a ground wiring and an RF signal wiring of a second part (e.g., non-bending part) of a flexible printed circuit board.

FIG. 7 is a view illustrating a cross-sectional structure of a flexible printed circuit board 700 according to various embodiments of the disclosure. FIG. 8A is a view illustrating a disposition structure of a ground wiring and an RF signal wiring of a first part (e.g., bending part) of a flexible printed circuit board. FIG. 8B is a view illustrating a disposition structure of a ground wiring and an RF signal wiring of a ground wiring and an RF signal wiring of a second part (e.g., non-bending part) of a flexible printed circuit board.

With reference to FIGS. 7, 8A and 8B, a flexible printed circuit board 700 (e.g., flexible printed circuit board 500 of FIGS. 4 and 5) may include a first area 701 (e.g., first part 510 (e.g., bent part) of FIG. 5) and a second area 702 (e.g., second part 520 (e.g., non-bent part) of FIG. 5). A second area 702 may be disposed on one side and the other side of the first area 701.

The first area 701 and the second area 702 may commonly include a first coverlay film 710, a first coverlay adhesive layer 715, a first flexible copper clad laminate (FCCL) protection layer 722, a second FCCL protection layer 742, a third FCCL protection layer 762, a second coverlay adhesive layer 780, and a second coverlay film 785.

As an example, the first coverlay film 710 may be disposed at an upper end (e.g., upper end in FIG. 7) of the flexible printed circuit board 700, and the second coverlay film 785 may be disposed at a lower end (e.g., lower end in FIG. 7) of the flexible printed circuit board 700 to protect the flexible printed circuit board 700.

Looking at the structure of the first area 701 shown in FIG. 8A, the first coverlay adhesive layer 715 (e.g., prepreg (PPG)) (e.g., bonding sheet) may be disposed on a lower part of the first coverlay film 710 (e.g., polyimide (PI)). The first FCCL protection layer 722 may be disposed on a lower part of the first coverlay adhesive layer 715. The first FCCL protection layer 722 may be adhered to the lower part of the first coverlay film 710 by the first coverlay adhesive layer 715. A dielectric layer 735 may be disposed on a lower part of the first FCCL protection layer 722. Here, a first air gap 730 having a certain height may be formed between the first FCCL protection layer 722 and the dielectric layer 735. The main signal wiring layer 746 may be disposed on a lower part of the dielectric layer 735. The main signal wiring layer 746 may be prevented from being exposed to air by the dielectric layer 735 disposed on an upper part of the main signal wiring layer 746. As an example, the dielectric layer 735 may be composed of the same film as the first coverlay film 710 and the same adhesive layer as the first coverlay adhesive layer 715. The second FCCL protection layer 742 may be disposed on a lower part of the main signal wiring layer 746. The third FCCL protection layer 762 may be disposed on a lower part of the second FCCL protection layer 742. Here, a second air gap 750 having a certain height may be formed between the second FCCL protection layer 742 and the third FCCL protection layer 762. The second coverlay adhesive layer 780 (e.g., prepreg (PPG)) (e.g., bonding sheet) may be disposed on a lower part of the third FCCL protection layer 762. The second coverlay film 785 (e.g., polyimide (PI)) may be disposed on a lower part of the second coverlay adhesive layer 780. The second coverlay film 785 may be adhered to a lower part of the third FCCL protection layer 762 by the second coverlay adhesive layer 780.

As an example, the first FCCL protection layer 722, the second FCCL protection layer 742, and the third FCCL protection layer 762 disposed in the first area 701 may be formed of an insulation dielectric (e.g., photo imageable solder resist (PSR)) (e.g., polyimide (PI)). As an example, the first coverlay film 710 and the second coverlay film 785 may include an electromagnetic interference (EMI) film (or EMI layer) for electromagnetic wave shield.

The first area 701 of the flexible printed circuit board 700 including the above-described constitutions may be formed of one or more layers having, combined, a first thickness (e.g., about 60 m or less).

Looking at the structure of the second area 702 (e.g., second part 520 (e.g., non-bent part) of FIG. 5) as shown in FIG. 8B, the second area 702 may include the first coverlay film 710, the first coverlay adhesive layer 715, the second coverlay adhesive layer 780, and the second coverlay film 785. Further, the second area 702 may include a plurality of signal layers (e.g., the first signal wiring layer 720, the second signal wiring layer 740, and the third signal wiring layer 760). The second signal wiring layer 740 may be disposed on substantially the same plane as that of the main signal wiring layer 746. The first coverlay adhesive layer 715 (e.g., prepreg (PPG)) (e.g., bonding sheet) may be disposed on the lower part of the first coverlay film 710 (e.g., polyimide (PI)). The first signal wiring layer 720 may be disposed on the lower part of the first coverlay adhesive layer 715.

As an example, the first signal wiring layer 720 may include the first FCCL protection layer 722 and a first FCCL conductive layer 724. The first FCCL protection layer 722 may be adhered to the lower part of the first coverlay film 710 by the first coverlay adhesive layer 715. The first FCCL conductive layer 724 may be disposed on a lower part of the first FCCL protection layer 722. The first FCCL protection layer 722 may be disposed on a lower part of the first FCCL conductive layer 724. The first adhesive layer 725 (e.g., prepreg (PPG)) may be disposed on the lower part of the first FCCL protection layer 722. The second signal wiring layer 740 may be disposed on a lower part of the first adhesive layer 725.

As an example, the second signal wiring layer 740 may include a second FCCL conductive layer 744 and the second FCCL protection layer 742. The second signal wiring layer 740 may be adhered to a lower part of the first signal wiring layer 720 by the first adhesive layer 725. Specifically, the second FCCL conductive layer 744 may be adhered to a lower part of the first adhesive layer 725. The second FCCL protection layer 742 may be adhered to a lower part of the second FCCL conductive layer 744. The second adhesive layer 745 (e.g., prepreg (PPG)) may be disposed on a lower part of the second FCCL protection layer 742. The third signal wiring layer 760 may be disposed on a lower part of the second adhesive layer 745.

As an example, the third signal wiring layer 760 may include the third FCCL protection layer 762 and a third FCCL conductive layer 764. The third signal wiring layer 760 may be adhered to a lower part of the second signal wiring layer 740 by the second adhesive layer 745. Specifically, the third FCCL protection layer 762 may be adhered to the lower part of the second FCCL protection layer 742 by the second adhesive layer 745. The third FCCL conductive layer 764 may be disposed on the lower part of the third FCCL protection layer 762. The second coverlay adhesive layer 780 (e.g., prepreg (PPG)) may be disposed on the lower part of the third FCCL protection layer 762. The second coverlay film 785 (e.g., polyimide (PI)) may be disposed on a lower part of the second coverlay adhesive layer 780. The second coverlay film 785 may be adhered to the lower part of the third FCCL protection layer 762 by the second coverlay adhesive layer 780. As an example, the first FCCL protection layer 722, the second FCCL protection layer 742, and the third FCCL protection layer 762 disposed in the second area 702 (e.g., second part 520 (e.g., non-bent part) of FIG. 5) may be formed of an insulation dielectric (e.g., photo imageable solder resist (PSR)). The first coverlay film 710 and the second coverlay film 785 may include an electromagnetic interference (EMI) film (or EMI layer) for electromagnetic wave shield.

The second area 702 (e.g., second part 520 of FIG. 5) of the flexible printed circuit board 700 including the above-described constitutions may be formed to have the second thickness, which is thicker than the sum of thicknesses of the entire layers of the first area 701 including the first thickness, and has no restriction on separate thickness.

According to an embodiment, the main signal wiring layer 746 of the first area 701 may include main RF signal wirings **746*a*-1, 746*a*-2, and 746*a*-3 for transmitting the RF signal, and main ground wirings 746*b*-1, 746*b*-2, 746*b*-3, and 746*b*-4. The RF signal wirings 746*a*-1, 746*a*-2**, and

746*a*-3 and the ground wirings 746*b*-1, 746*b*-2, 746*b*-3, and 746*b*-4 may be alternately disposed on the same plane.

As an example, the ground wirings 746*b*-1, 746*b*-2, 746*b*-3, and 746*b*-4 may be disposed on both sides of the respective RF signal wirings 746*a*-1, 746*a*-2, and 746*a*-3. The first ground wiring 746*b*-1 may be disposed on a first side of the first RF signal wiring 746*a*-1, and the second ground wiring 746*b*-2 may be disposed on the second side thereof. The second ground wiring 746*b*-2 may be disposed on a first side of the second RF signal wiring 746*a*-2, and the third ground wiring 746*b*-3 may be disposed on the second side thereof. The third ground wiring 746*b*-3 may be disposed on a first side of the third RF signal wiring 746*a*-3, and the fourth ground wiring 746*b*-4 may be disposed on the second side thereof.

According to an embodiment, the main RF signal wirings 746*a*-1, 746*a*-2, and 746*a*-3 and the main ground wirings 746*b*-1, 746*b*-2, 746*b*-3, and 746*b*-4 may have a line width d1 of a first value. The main RF signal wirings 746*a*-1, 746*a*-2, and 746*a*-3 and the main ground wirings 746*b*-1, 746*b*-2, 746*b*-3, and 746*b*-4 may be disposed to have an interval of a second value. The line width d1 of the first value of the main RF signal wirings 746*a*-1, 746*a*-2, and 746*a*-3 and the main ground wirings 746*b*-1, 746*b*-2, 746*b*-3, and 746*b*-4 may be larger than the interval d2 of a second value. As an embodiment, the ratio of the line width d1 of the first value to the interval d2 of the second value may be 5:1 to 20:1. That is, the line width d1 of the first value may be formed to be 5 to 20 times larger than the interval d2 of the second value.

According to an embodiment, the first FCCL conductive layer 724 of the first signal wiring layer 720 formed in the second area 702 may include a first ground wiring 724*b*.

According to an embodiment, the second FCCL conductive layer 744 of the second signal wiring layer 740 formed in the second area 702 may include RF signal wirings 744*a* for transmitting the RF signal, and second ground wirings 744*b*. The second RF signal wirings 744*a* and the second ground wirings 744*b* may be alternately disposed on the same layer.

According to an embodiment, the third FCCL conductive layer 764 of the third signal wiring layer 760 formed in the second area 702 may include a third ground wiring 764*b*.

According to an embodiment, comparing and looking at the first area 701 and the second area 702, the second area 702 may include the first FCCL conductive layer 724 on which a copper foil is formed, the second FCCL conductive layer 744, and the third FCCL conductive layer 764. In contrast, the first area 701 may include the single main signal layer 746 on which a copper foil is formed.

As an example, on the upper part (or lower part) of the first FCCL protection layer 722 of the first area 701, the copper foil layer (e.g., first FCCL conductive layer 724) is removed, and in order to secure high flexural characteristics, the second air gap 750 is formed between the second FCCL protection layer 742 and the third FCCL protection layer 762.

As an example, a copper foil layer (e.g., third FCCL conductive layer 764) is removed from the under part of the third FCCL protection layer 762 of the first area 701. To ensure high flexural properties, a second air gap 750 is formed between the second FCCL protection layer 742 and the third FCCL protection layer 762.

As an example, the first air gap 730 and the first adhesive layer 725 may be positioned on the same plane at least partly.

As an example, the dielectric layer 735 and a first adhesive layer 725 may be positioned on the same plane at least partly.

As an example, the second air gap 750 and the second adhesive layer 745 may be positioned on the same plane at least partly.

According to an embodiment, since the single main signal wiring layer 746 is disposed in the first area 701, the first ground wiring 724*b* disposed on the first FCCL conductive layer 724 of the second area 702 should be connected to the main signal wiring layer 746. As an example, the first ground wiring 724*b* disposed on the first FCCL conductive layer 724 may be electrically connected to the main ground wirings 746*b* through first vias 770*a* and second vias 770*b*.

According to an embodiment, the RF signal wirings 744*a* and the second ground wirings 744*b* disposed on the second FCCL conductive layer 744 of the second area 702 may be connected to the main signal wiring layer 746.

According to an embodiment, since the single main signal wiring layer 746 is disposed in the first area 701, the third ground wiring 764*b* disposed on the third FCCL conductive layer 764 of the second area 702 should be connected to the main signal wiring layer 746. As an example, the third ground wiring 764*b* disposed on the third FCCL conductive layer 764 may be electrically connected to the main ground wirings 746*b* through the first vias 770*a* and the second vias 770*b*.

As described above, the first ground wiring 724*b* may be disposed on upper parts of the RF signal wirings 744*a* disposed on the second FCCL conductive layer 744, the second ground wiring 764*b* may be disposed on lower parts thereof. That is, two ground wirings 724*b* and 764*b* may be disposed on the upper and lower parts of one RF signal wiring 744*a*.

The disposition structure of the ground wirings and the RF signal wirings of the second part (e.g., non-bent part) is not limited to that illustrated in FIG. 8B, and the disposition structure of the ground wirings and the RF signal wirings of the second part (e.g., non-bent part) may be variously changed.

Figure 9:
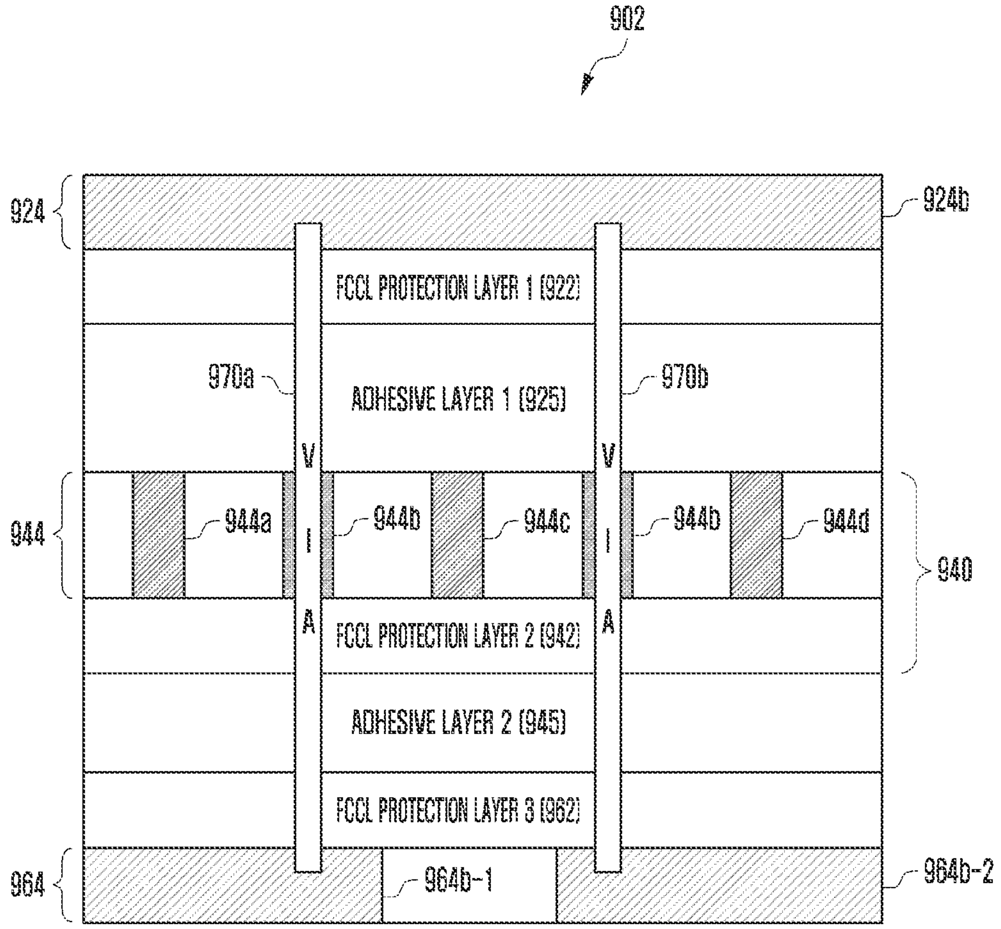
FIG. 9 is a view illustrating a disposition structure of a ground wiring and an RF signal wiring of a second part (e.g., non-bending part) of a flexible printed circuit board according to various embodiments of the disclosure.

FIG. 9 is a view illustrating a disposition structure of a ground wiring and an RF signal wiring of a second part (e.g., non-bending part) of a flexible printed circuit board according to various embodiments of the disclosure. In describing FIG. 9, the detailed description of the same structure as that of FIG. 8B may be omitted.

With reference to FIG. 9, the first signal wiring layer (e.g., first signal wiring layer 720 of FIG. 8B) may include a first FCCL protection layer 922 and a first FCCL conductive layer 924. The first FCCL protection layer 922 may be disposed on a lower part of the first FCCL conductive layer 924. A first adhesive layer 925 may be disposed on a lower part of the first FCCL protection layer 922. A second signal wiring layer 940 (e.g., second signal wiring layer 740 of FIG. 8B) may be disposed on a lower part of the first adhesive layer 925. The second signal wiring layer 940 may include a second FCCL protection layer 942 and a second FCCL conductive layer 944. The second FCCL conductive layer 944 may be disposed on the lower part of the first adhesive layer 925. The second FCCL protection layer 942 may be disposed on a lower part of the second FCCL conductive layer 944. The second adhesive layer 945 may be disposed on a lower part of the second FCCL protection layer 942. A third signal wiring layer (e.g., third signal wiring layer 760 of FIG. 8B) may be disposed on a lower part of the second adhesive layer 945. The third signal wiring layer may include a third FCCL protection layer 962 and a third FCCL conductive layer 964. The third FCCL protection layer 962 may be disposed on the lower part of the second adhesive layer 945. The third FCCL conductive layer 964 may be disposed on a lower part of the third FCCL protection layer 962.

According to an embodiment, the first FCCL conductive layer 924 formed in the second area 902 may include a first ground wiring 924*b*.

According to an embodiment, the second FCCL conductive layer 944 of the second signal wiring layer 940 formed in the second area 902 may include RF signal wirings 944*a*, 944*c*, and 944*d* for transmitting the RF signal and the second ground wirings 944*b*. The RF signal wirings 944*a*, 944*c*, and 944*d* and the second ground wirings 944*b* may be alternately disposed on the same layer. As an embodiment, the RF signal wirings 944*a*, 944*c*, and 944*d* disposed on the second FCCL conductive layer 744 may include the first RF signal wiring 944*a*, the second RF signal wiring 944*c*, and the third RF signal wiring 944*d*.

As an embodiment, the first ground wiring 924*b* may be disposed to at least overlap the first RF signal wiring 944*a*, the second RF signal wiring 944*c*, and the third RF signal wiring 944*d*.

According to an embodiment, the third FCCL conductive layer 964 of the third signal wiring layer (e.g., third signal wiring layer 760 of FIG. 8B) formed in the second area 902 may include a third ground wiring 964*b*-1 and a fourth ground wiring 964*b*-2.

According to an embodiment, the third ground wiring 964*b*-1 may be disposed to at least overlap the first RF signal wiring 944*a* and the second RF signal wiring 944*c*. As an embodiment, the fourth ground wiring 964*b*-2 may be disposed to at least overlap the second RF signal wiring 944*c* and the third RF signal wiring 944*d*.

As an embodiment, the first ground wiring 924*b*, the second ground wiring 944*b*, and the third ground wiring 964*b*-1 may be electrically connected to one another through a first via 970*a*.

According to an embodiment, the first ground wiring 924*b*, the second ground wiring 944*b*, and the fourth ground wiring 964*b*-2 may be electrically connected to one another through a second via 970*a*.

As an embodiment, the first ground wiring 924*b* may be disposed on an upper part of the first RF signal wiring 944*a* among the RF signal wirings 944*a*, 944*c*, and 944*d* disposed on the second FCCL conductive layer 944, and the third ground wiring 964*b*-1 may be disposed on a lower part thereof. That is, two ground wirings 924*b* and 964*b*-1 may be disposed above and below the one first RF signal wiring 944*a*.

As an embodiment, the first ground wiring 924*b* may be disposed on an upper part of the second RF signal wiring 944*c* among the RF signal wirings 944*a*, 944*c*, and 944*d* disposed on the second FCCL conductive layer 944, and the ground wiring may not be disposed on a lower part thereof.

As an embodiment, the first ground wiring 924*b* may be disposed on an upper part of the third RF signal wiring 944*d* among the RF signal wirings 944*a*, 944*c*, and 944*d* disposed on the second FCCL conductive layer 944, and the fourth ground wiring 964*b*-2 may be disposed on a lower part thereof. That is, two ground wirings 924*b* and 964*b*-2 may be disposed above and below the one first RF signal wiring 944*a*.

As described above, two ground wirings 924*b* and 964*b*-1 may be disposed above and below the first RF signal wiring 944*a*, one ground wiring 924*b* may be disposed on the upper part (or lower part) of the second RF signal wiring 944*c*, and two ground wirings 924*b* and 964*b*-2 may be disposed above and below the third RF signal wiring 944*d*.

Figure 10:
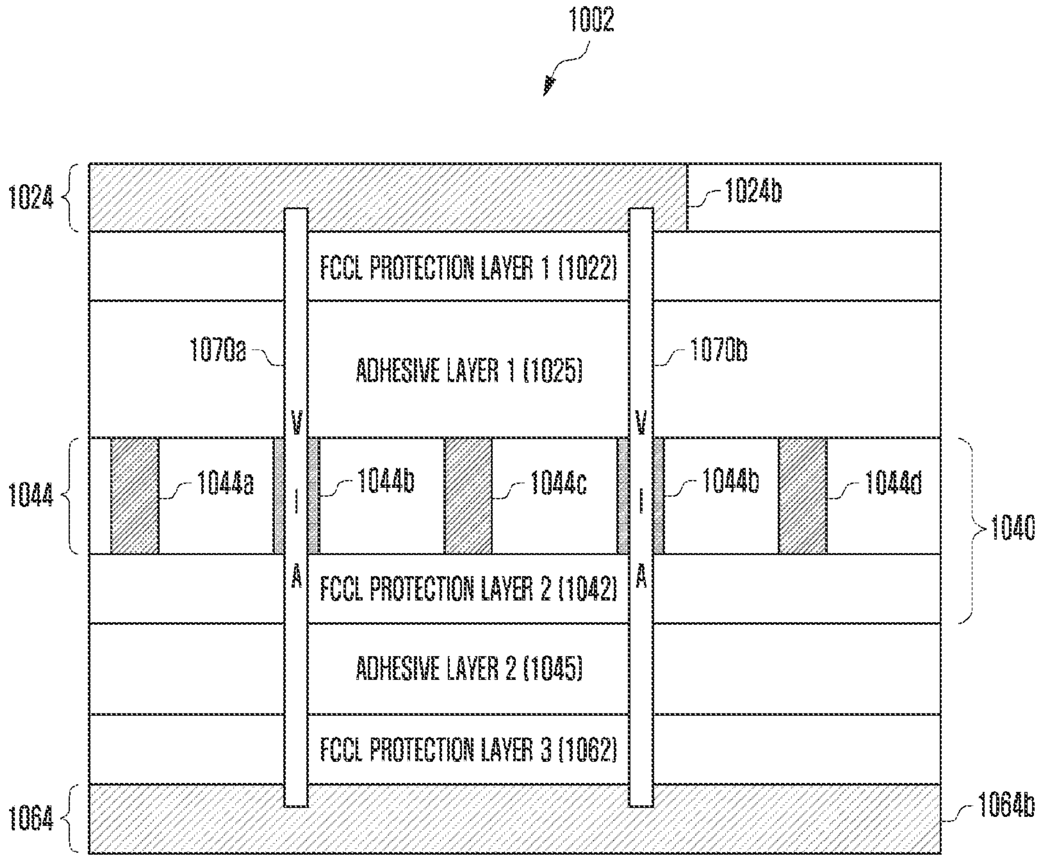
FIG. 10 is a view illustrating a disposition structure of a ground wiring and an RF signal wiring of a second part (e.g., non-bending part) of a flexible printed circuit board according to various embodiments of the disclosure.

FIG. 10 is a view illustrating a disposition structure of a ground wiring and an RF signal wiring of a second part (e.g., non-bending part) of a flexible printed circuit board according to various embodiments of the disclosure. In describing FIG. 10, the detailed description of the same structure as that of FIG. 8B may be omitted.

With reference to FIG. 10, the first signal wiring layer (e.g., first signal wiring layer 720 of FIG. 8B) may include a first FCCL protection layer 1022 and a first FCCL conductive layer 1024. The first FCCL protection layer 1022 may be disposed on a lower part of the first FCCL conductive layer 1024. A first adhesive layer 1025 may be disposed on a lower part of the first FCCL protection layer 1022. A second signal wiring layer 1040 (e.g., second signal wiring layer 740 of FIG. 8B) may be disposed on a lower part of the first adhesive layer 1025. The second signal wiring layer 1040 may include a second FCCL protection layer 1042 and a second FCCL conductive layer 1044. The second FCCL conductive layer 1044 may be disposed on the lower part of the first adhesive layer 1025. The second FCCL protection layer 1042 may be disposed on a lower part of the second FCCL conductive layer 1044. The second adhesive layer 1045 may be disposed on a lower part of the second FCCL protection layer 1042. A third signal wiring layer (e.g., third signal wiring layer 760 of FIG. 8B) may be disposed on a lower part of the second adhesive layer 1045. The third signal wiring layer may include a third FCCL protection layer 1062 and a third FCCL conductive layer 1064. The third FCCL protection layer 1062 may be disposed on the lower part of the second adhesive layer 1045. The third FCCL conductive layer 1064 may be disposed on a lower part of the third FCCL protection layer 1062.

According to an embodiment, the first FCCL conductive layer 1024 formed in the second area 1002 may include a first ground wiring 1024*b*. According to an embodiment, the second FCCL conductive layer 1044 of the second signal wiring layer 1040 formed in the second area 1002 may include RF signal wirings 1044*a*, 1044*c*, and 1044*d* for transmitting the RF signal and the second ground wirings 1044*b*. The RF signal wirings 1044*a*, 1044*c*, and 1044*d* and the second ground wirings 1044*b* may be alternately disposed on the same layer. As an embodiment, the RF signal wirings 1044*a*, 1044*c*, and 1044*d* disposed on the second FCCL conductive layer 1044 may include the first RF signal wiring 1044*a*, the second RF signal wiring 1044*c*, and the third RF signal wiring 1044*d*.

As an embodiment, the first ground wiring 1024*b* may be disposed to at least overlap the first RF signal wiring 1044*a* and the second RF signal wiring 1044*c*. The first ground wiring 1024*b* may not overlap the third RF signal wiring 1044*d*.

According to an embodiment, the third FCCL conductive layer 1064 of the third signal wiring layer (e.g., third signal wiring layer 760 of FIG. 8B) formed in the second area 1002 may include a third ground wiring 1064*b*.

According to an embodiment, the third ground wiring 1064*b* may be disposed to at least overlap the first RF signal wiring 1044*a*, the second RF signal wiring 1044*c*, and the third RF signal wiring 1044*d*.

As an embodiment, the first ground wiring 1024*b*, the second ground wiring 1044*b*, and the third ground wiring 1064*b* may be electrically connected to one another through a first via 1070*a* and a second via 1070*b*.

As an embodiment, the first ground wiring 1024*b* may be disposed on an upper part of the first RF signal wiring 1044*a* among the RF signal wirings 1044*a*, 1044*c*, and 1044*d* disposed on the second FCCL conductive layer 1044, and the third ground wiring 1064*b* may be disposed on a lower part thereof. That is, two ground wirings 1024*b* and 1064*b* may be disposed above and below the one first RF signal wiring 1044*a*.

As an embodiment, the first ground wiring 1024*b* may be disposed on an upper part of the second RF signal wiring 1044*c* among the RF signal wirings 1044*a*, 1044*c*, and 1044*d* disposed on the second FCCL conductive layer 1044, and the third ground wiring 1064*b* may be disposed on a lower part thereof. That is, two ground wirings 1024*b* and 1064*b* may be disposed above and below the one second RF signal wiring 1044*c*.

As an embodiment, the ground wiring may not be disposed on an upper part of the third RF signal wiring 1044*d* among the RF signal wirings 1044*a*, 1044*c*, and 1044*d* disposed on the second FCCL conductive layer 1044. The third ground wiring 1064*b* may be disposed on a lower part of the third RF signal wiring 1044*d*. That is, one ground wiring 1064*b* may be disposed on the lower part (or the upper part) of the one third RF signal wiring 1044*d*.

As described above, two ground wirings 1024*b* and 1064*b* may be disposed above and below the first RF signal wiring 1044*a*, one ground wiring 1024*b* may be disposed on the upper part (or lower part) of the second RF signal wiring 1044*c*, and two ground wirings 1024*b* and 1064*b* may be disposed above and below the third RF signal wiring 1044*d*.

Figure 11:
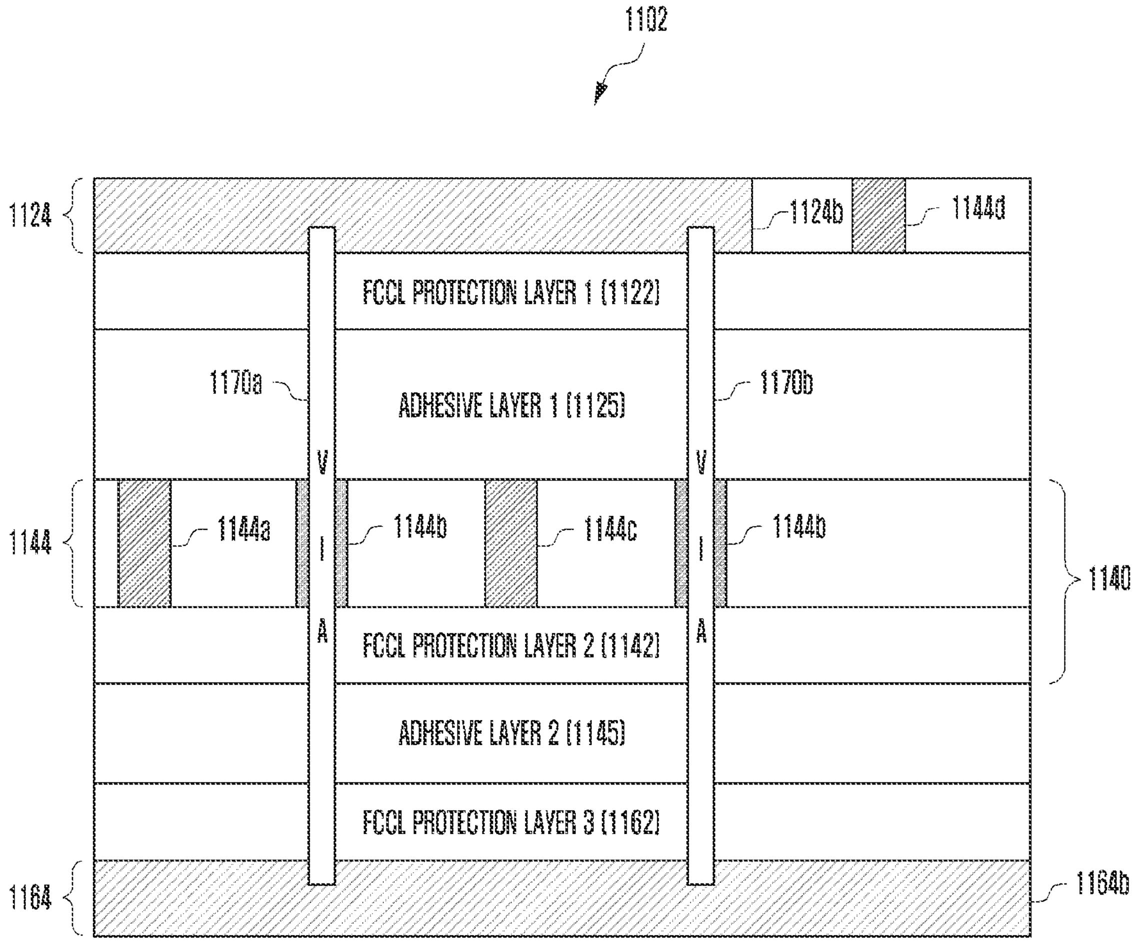
FIG. 11 is a view illustrating a disposition structure of a ground wiring and an RF signal wiring of a second part (e.g., non-bending part) of a flexible printed circuit board according to various embodiments of the disclosure.

FIG. 11 is a view illustrating a disposition structure of a ground wiring and an RF signal wiring of a second part (e.g., non-bending part) of a flexible printed circuit board according to various embodiments of the disclosure. In describing FIG. 11, the detailed description of the same structure as that of FIG. 8B may be omitted.

With reference to FIG. 11, the first signal wiring layer (e.g., first signal wiring layer 720 of FIG. 8B) may include a first FCCL protection layer 1122 and a first FCCL conductive layer 1124. The first FCCL protection layer 1122 may be disposed on a lower part of the first FCCL conductive layer 1124. A first adhesive layer 1125 may be disposed on a lower part of the first FCCL protection layer 1122. A second signal wiring layer 1140 (e.g., second signal wiring layer 740 of FIG. 8B) may be disposed on a lower part of the first adhesive layer 1125. The second signal wiring layer 1140 may include a second FCCL protection layer 1142 and a second FCCL conductive layer 1144. The second FCCL conductive layer 1144 may be disposed on the lower part of the first adhesive layer 1125. The second FCCL protection layer 1142 may be disposed on a lower part of the second FCCL conductive layer 1144. A second adhesive layer 1145 may be disposed on a lower part of the second FCCL protection layer 1142. A third signal wiring layer (e.g., third signal wiring layer 760 of FIG. 8B) may be disposed on a lower part of the second adhesive layer 1145. The third signal wiring layer may include a third FCCL protection layer 1162 and a third FCCL conductive layer 1164. The third FCCL protection layer 1162 may be disposed on the lower part of the second adhesive layer 1145. The third FCCL conductive layer 1164 may be disposed on a lower part of the third FCCL protection layer 1162.

According to an embodiment, the first FCCL conductive layer 1124 formed in the second area 1102 may include a first ground wiring 1124*b* and a third RF signal wiring 1144*d*. The first ground wiring 1124*b* and the third RF signal wiring 1144*d* may be disposed on the same layer.

According to an embodiment, the second FCCL conductive layer 1144 of the second signal wiring layer 1140 formed in the second area 1102 may include RF signal wirings 1144*a* and 1044*c* for transmitting the RF signal and the second ground wirings 1144*b*. The RF signal wirings 1144*a* and 1044*c*, and the second ground wirings 1144*b* may be alternately disposed on the same layer. As an embodiment, the RF signal wirings 1144*a* and 1044*c* disposed on the second FCCL conductive layer 1144 may include the first RF signal wiring 1144*a* and the second RF signal wiring 1144*c*.

As an embodiment, the first ground wiring 1124*b* may be disposed to at least overlap the first RF signal wiring 1144*a* and the second RF signal wiring 1144*c*. The first ground wiring 1124*b* and the third RF signal wiring 1144*d* may be disposed on the same plane.

According to an embodiment, the third FCCL conductive layer 1164 of the third signal wiring layer (e.g., third signal wiring layer 760 of FIG. 8B) formed in the second area 1102 may include a third ground wiring 1164*b*.

As an embodiment, the third ground wiring 1164*b* may be disposed to at least overlap the first RF signal wiring 1144*a*, the second RF signal wiring 1144*c*, and the third RF signal wiring 1144*d*.

As an embodiment, the first ground wiring 1124*b*, the second ground wiring 1144*b*, and the third ground wiring 1164*b* may be electrically connected to one another through a first via 1170*a* and a second via 1170*b*.

As an embodiment, the first ground wiring 1124*b* may be disposed on an upper part of the first RF signal wiring 1144*a* of the RF signal wirings 1144*a* and 1144*c* disposed on the second FCCL conductive layer 1144, and the third ground wiring 1164*b* may be disposed on a lower part thereof. That is, two ground wirings 1124*b* and 1164*b* may be disposed above and below the one first RF signal wiring 1144*a*.

As an embodiment, the first ground wiring 1124*b* may be disposed on an upper part of the second RF signal wiring 1144*c* of the RF signal wirings 1144*a* and 1044*c* disposed on the second FCCL conductive layer 1144, and the third ground wiring 1164*b* may be disposed on a lower part thereof. That is, two ground wirings 1124*b* and 1164*b* may be disposed above and below the one second RF signal wiring 1144*c*.

As an embodiment, the ground wiring may not be disposed on an upper part of the third RF signal wiring 1144*d* disposed on the first FCCL conductive layer 1124. The third ground wiring 1164*b* may be disposed on a lower part of the third RF signal wiring 1144*d*. That is, one ground wiring 1164*b* may be disposed on the lower part (or the upper part) of the one third RF signal wiring 1144*d*.

As described above, two ground wirings 1124*b* and 1164*b* may be disposed above and below the first RF signal wiring 1144*a*, two ground wirings 1124*b* and 1164*b* may be disposed above and below the second RF signal wiring 1144*c*, and one ground wiring 1164*b* may be disposed on the lower part (or upper part) of the third RF signal wiring 1144*d*.

Figure 12:
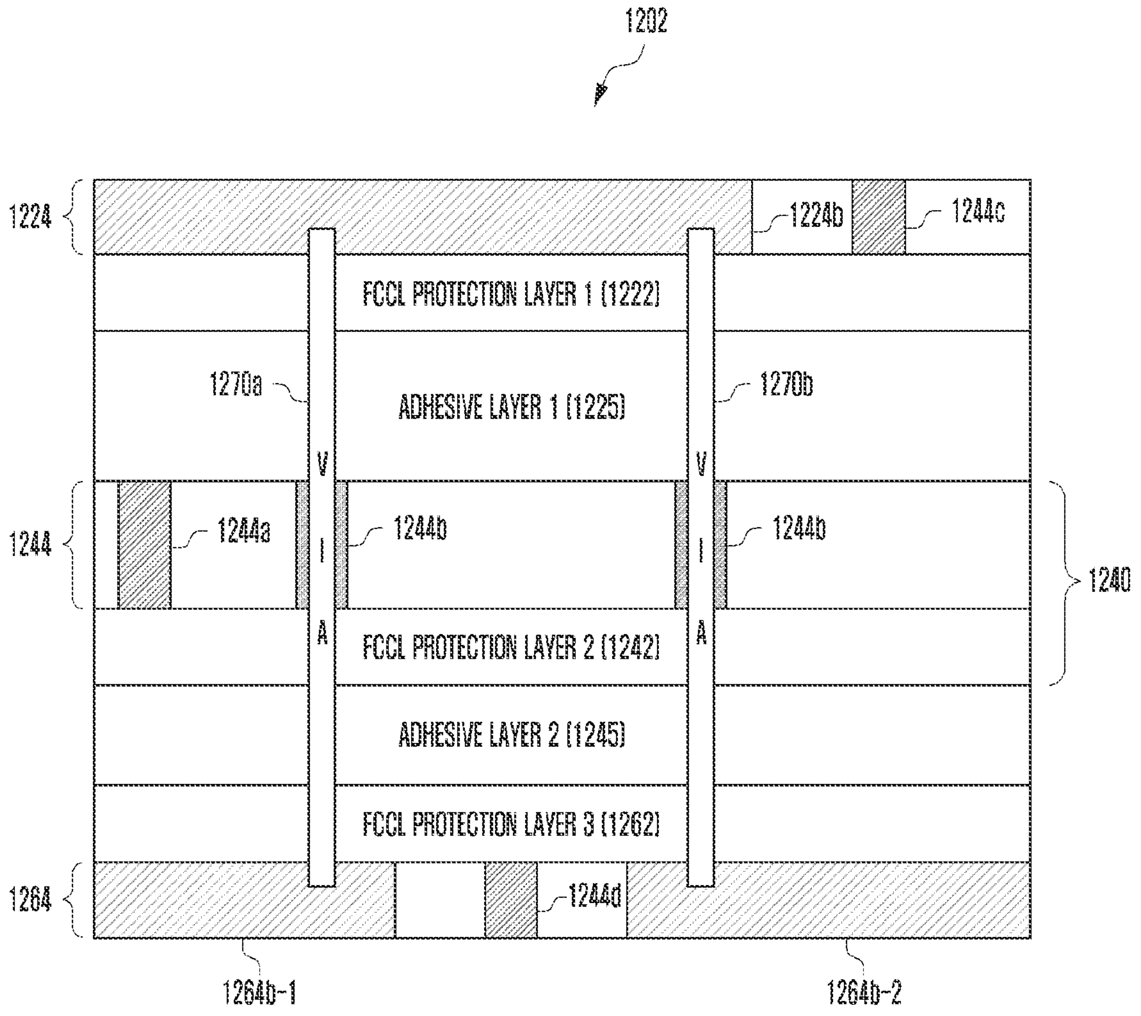
FIG. 12 is a view illustrating a disposition structure of a ground wiring and an RF signal wiring of a second part (e.g., non-bending part) of a flexible printed circuit board according to various embodiments of the disclosure.
Figure 13A:
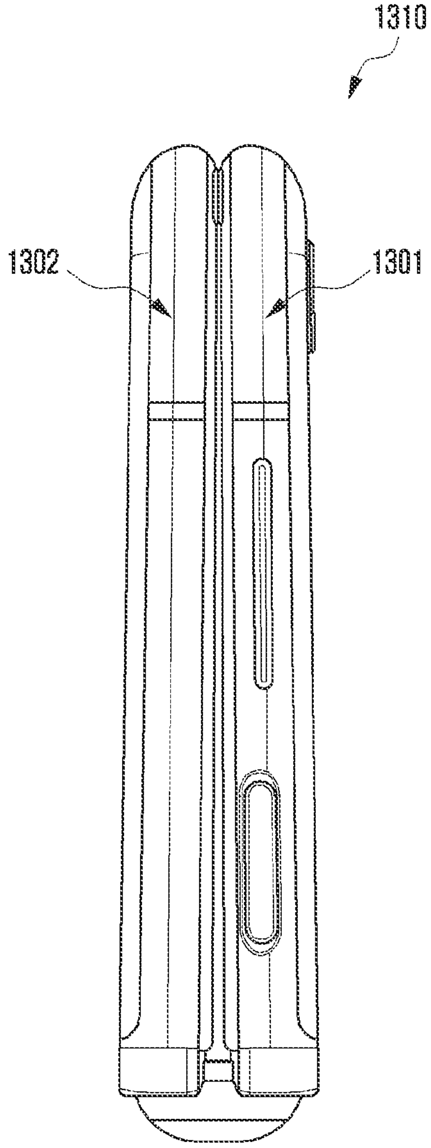
FIGS. 13A and 13B are views illustrating a shape of a flexible printed circuit board when a foldable electronic device is in a folded state according to various embodiments of the disclosure.
Figure 13B:
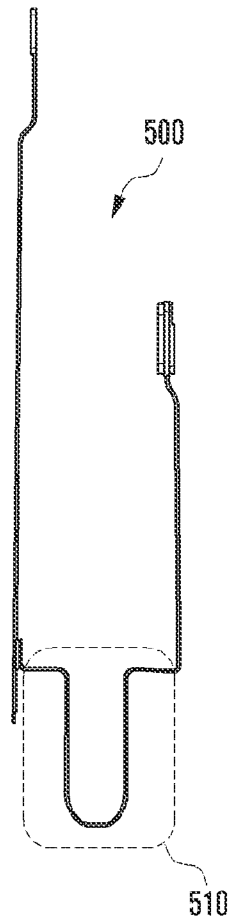
Figure 13C:
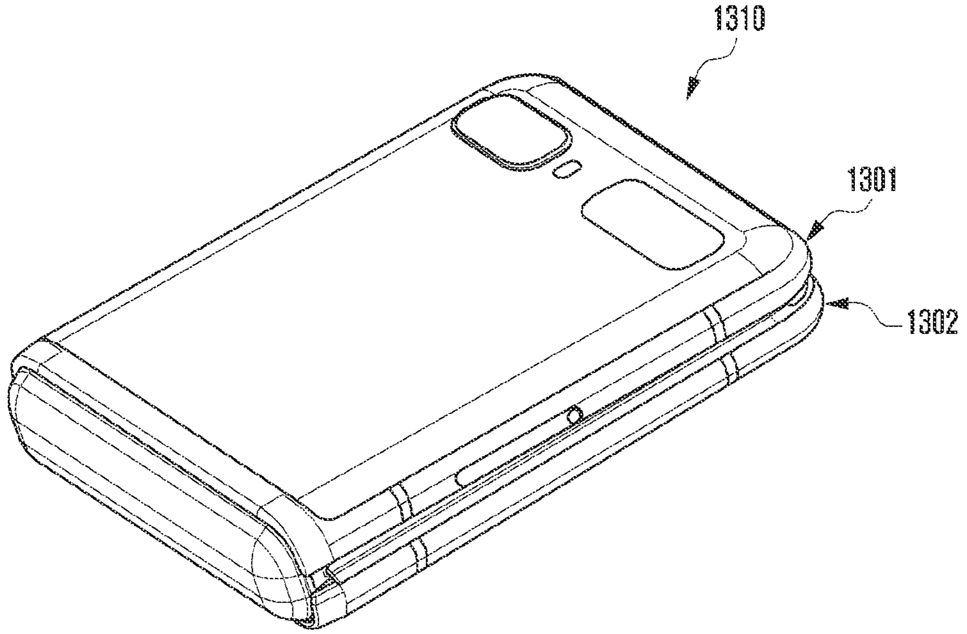
FIGS. 13C and 13D are views illustrating a shape of a flexible printed circuit board when a foldable electronic device is in a folded state according to various embodiments of the disclosure.
Figure 13D:
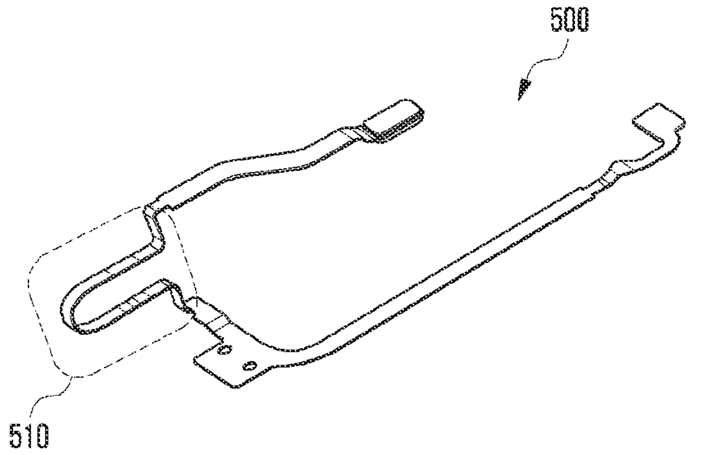

FIG. 12 is a view illustrating a disposition structure of a ground wiring and an RF signal wiring of a second part (e.g., non-bending part) of a flexible printed circuit board according to various embodiments of the disclosure. In describing FIG. 12, the detailed description of the same structure as that of FIG. 8B may be omitted.

With reference to FIG. 12, the first signal wiring layer (e.g., first signal wiring layer 720 of FIG. 8B) may include a first FCCL protection layer 1222 and a first FCCL conductive layer 1224. The first FCCL protection layer 1222 may be disposed on a lower part of the first FCCL conductive layer 1224. A first adhesive layer 1225 may be disposed on a lower part of the first FCCL protection layer 1222. A second signal wiring layer 1240 (e.g., second signal wiring layer 740 of FIG. 8B) may be disposed on a lower part of the first adhesive layer 1225. The second signal wiring layer 1240 may include a second FCCL protection layer 1242 and a second FCCL conductive layer 1244. The second FCCL conductive layer 1244 may be disposed on the lower part of the first adhesive layer 1225. The second FCCL protection layer 1242 may be disposed on a lower part of the second FCCL conductive layer 1244. A second adhesive layer 1245 may be disposed on a lower part of the second FCCL protection layer 1242. A third signal wiring layer (e.g., third signal wiring layer 760 of FIG. 8B) may be disposed on a lower part of the second adhesive layer 1245. The third signal wiring layer may include a third FCCL protection layer 1262 and a third FCCL conductive layer 1264. The third FCCL protection layer 1262 may be disposed on the lower part of the second adhesive layer 1245. The third FCCL conductive layer 1264 may be disposed on a lower part of the third FCCL protection layer 1262.

According to an embodiment, the first FCCL conductive layer 1224 formed in the second area 1202 may include a first ground wiring 1224*b* and a second RF signal wiring 1244*c* for transmitting the RF signal. The first ground wiring 1224*b* and the second RF signal wiring 1244*c* may be disposed on the same layer.

According to an embodiment, the second FCCL conductive layer 1244 of the second signal wiring layer 1240 formed in the second area 1202 may include a first RF signal wiring 1244*a* for transmitting the RF signal and the second ground wirings 1244*b*. The first RF signal wiring 1244*a* and the second ground wirings 1244*b* may be disposed on the same layer.

As an embodiment, the first ground wiring 1224*b* may be disposed to at least overlap the first RF signal wiring 1244*a* and the third RF signal wiring 1244*d*. The first ground wiring 1224*b* and the second RF signal wiring 1244*c* may be disposed on the same plane.

According to an embodiment, the third FCCL conductive layer 1264 of the third signal wiring layer (e.g., third signal wiring layer 760 of FIG. 8B) formed in the second area 1202 may include a third ground wiring 1264*b*-1 and a fourth ground wiring 1264*b*-2.

As an embodiment, the third ground wiring 1264*b*-1 may be disposed to at least overlap the first RF signal wiring 1244*a*.

As an embodiment, the fourth ground wiring 1264*b*-2 may be disposed to at least overlap the second RF signal wiring 1244*c*.

As an embodiment, the first ground wiring 1224*b*, the second ground wirings 1244*b* and the third ground wiring 1264*b*-1 may be electrically connected to one another through a first via 1270*a*.

As an embodiment, the first ground wiring 1224*b*, the second ground wirings 1244*b* and the third ground wiring 1264*b*-1 may be electrically connected to one another through a second via 1270*b*.

As an embodiment, the first ground wiring 1224*b* may be disposed on an upper part of the first RF signal wiring 1244*a* disposed on the second FCCL conductive layer 1244, and the third ground wiring 1264*b*-1 may be disposed on a lower part thereof. That is, two ground wirings 1224*b* and 1264*b*-1 may be disposed above and below the one first RF signal wiring 1244*a*.

As an embodiment, the ground wiring may not be disposed on an upper part of the second RF signal wiring 1244*c* disposed on the first FCCL conductive layer 1224. A fourth ground wiring 1264*b*-2 may be disposed on a lower part of the second RF signal wiring 1244*c*. That is, one ground wiring 1264*b*-2 may be disposed on the lower part (or upper part) of the one second RF signal wiring 1244*c*.

As an embodiment, the first ground wiring 1224*b* may be disposed on the upper part of the third RF signal wiring 1244*d* disposed on the third FCCL conductive layer 1264. The ground wiring may not be disposed on the upper part (or lower part) of the third RF signal wiring 1244*d*. That is, one ground wiring 1224*b* may be disposed on the upper part (or lower part) of the one third RF signal wiring 1244*d*.

As described above, the first RF signal wiring 1244*a*, the second RF signal wiring 1244*c*, and the third RF signal wiring 1244*d* may be disposed on different layers. Two ground wirings 1224*b* and 1264*b*-1 may be disposed above and below the first RF signal wiring 1244*a*, one ground wiring 1224*b* may be disposed on the upper part (or lower part) of the second RF signal wiring 1244*c*, and one ground wiring 1264*b*-2 may be disposed on the lower part (or upper part) of the third RF signal wiring 1244*d*.

Figure 15:
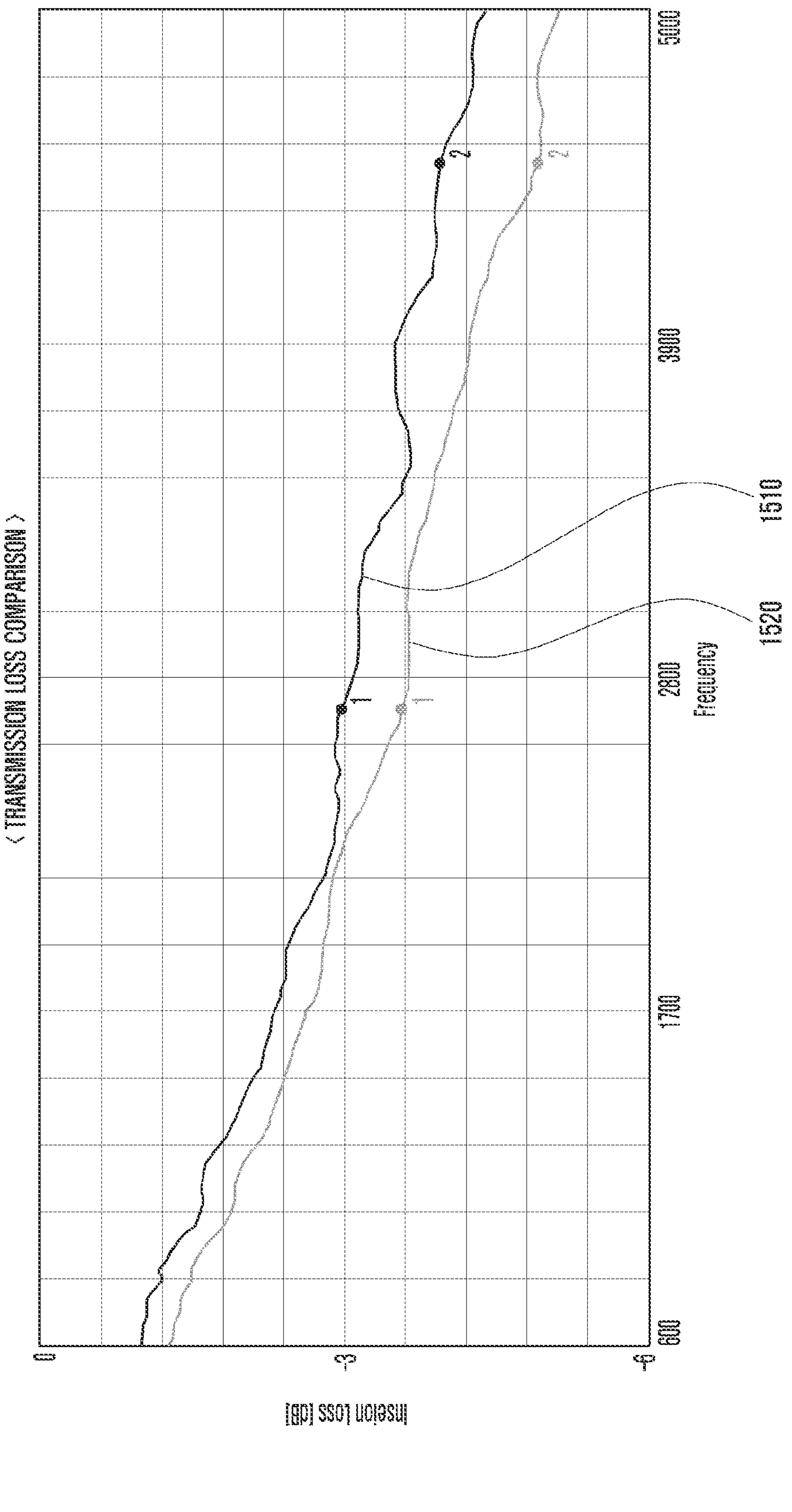
FIG. 15 is a diagram illustrating that signal interference is improved in the whole frequency area through a flexible printed circuit board according to an embodiment of the disclosure.

FIGS. 13A to 13D are views illustrating shapes of a flexible printed circuit board when a foldable electronic device is in a folded state according to various embodiments of the disclosure. FIGS. 14A, 14B, and 14C are views illustrating shapes of a flexible printed circuit board when a foldable electronic device is in a flat state according to various embodiments of the disclosure. FIG. 15 is a diagram illustrating that signal interference is improved in the whole frequency area through a flexible printed circuit board according to an embodiment of the disclosure.

With reference to FIGS. 13A to 14C, the electronic device (e.g., electronic device 400 of FIG. 4) may be folded or unfolded through the hinge structure (e.g., hinge structure 480 of FIG. 4), and when the electronic device 400 is folded and unfolded, the first part 510 (e.g., bent part) of the flexible printed circuit board 500 is bent (e.g., folded or unfolded). Here, the first part 510 (e.g., bent part) of the flexible printed circuit board 500 may be formed to have a thickness that is thicker than the second part (e.g., second part 520 of FIG. 5) (e.g., non-bent part).

According to an embodiment, when the electronic device (e.g., electronic device 400 of FIG. 4) is in the folded state (1310), the first part 1301 and the second part 1032 may approach or come in contact with each other based on the fold position (e.g., fold position of FIG. 4). In order to prevent the flexible printed circuit board 500 from being damaged or disconnected in the folded state (1310) of the electronic device 400, the first part 510 of the flexible printed circuit board 500 may be disposed to at least partly overlap the fold position (e.g., hinge structure 480 of FIG. 4) in which the electronic device 400 is folded.

According to an embodiment, when the electronic device 400 is in the flat state (1320), the first part 401 and the second part 402 may be unfolded and may be spaced apart from each other based on the fold position. In order to prevent the damage or disconnection of the flexible printed circuit board 500 in the part (e.g., fold position) where the flexible printed circuit board 500 is folded and then is unfolded, the first part 510 of the flexible printed circuit board 500 may be disposed to at least partly overlap the fold position (e.g., hinge structure 480).

In FIG. 15, the reference numeral "1510" denotes a transmission loss rate (1510) when the flexible printed circuit board (e.g., flexible printed circuit board 500 of FIGS. 4 and 5 or flexible printed circuit board 700 of FIG. 7) of the disclosure is applied to the electronic device (e.g., mobile electronic device). The reference numeral "1520" denotes a transmission loss rate (1520) when a general flexible printed circuit board is applied to the electronic device (e.g., mobile electronic device). In case that the flexible printed circuit board according to an embodiment of the disclosure is applied to the electronic device, it can be identified that a transmission loss is reduced in the frequency band of 600 MHz to 5.0 GHz in comparison to the case where the general flexible printed circuit board is applied.

In case that the flexible printed circuit board of the disclosure is applied to the electronic device, the RF signal wirings and the ground wirings of the first signal wiring layer (e.g., first signal wiring layer 720 of FIG. 8B), the second signal wiring layer (e.g., second signal wiring layer 740 of FIG. 8B), and the third signal wiring layer (e.g., third signal wiring layer 760 of FIG. 8B can be formed with a wide line width, and thus the signal transmission loss can be reduced.

Comparing and looking at the transmission loss rate 1510 of the flexible printed circuit board according to the disclosure with the transmission loss rate 1520 of the general flexible printed circuit board, it can be identified that the flexible printed circuit board according to the disclosure has a reduced insertion loss of the flexible RF cable (FRC) as compared with the transmission loss rate 1520 of the general flexible printed circuit board that requires a separate EMI film layer (or separate ground layer). Further, the general flexible printed circuit board requires a separate EMI film layer (or separate ground layer), and thus the thickest layer has a thickness of about 70 m, whereas the flexible printed circuit board according to the disclosure has a thickness of about 50 m or less, and thus the damage due to the opening and closing of the foldable electronic device can be reduced.

The flexible printed circuit board according to various embodiments of the disclosure is not damaged even after repeated folding and unfolding (e.g., opening and closing) in the folding area where the display is folded.

The flexible printed circuit board according to various embodiments of the disclosure has the protection layers disposed on upper and lower parts of the main signal wiring layer of the first part (e.g., bending part), and thus can prevent the interference of the electric field by the metal utensils of the electronic device during the repeated folding and unfolding (e.g., opening and closing). Through this, the impedance mismatch of the RF signal being transmitted through the flexible printed circuit board can be prevented, and thus the improved signal transmission performance can be obtained.

The foldable electronic device according to various embodiments of the disclosure is not damaged even after the flexible printed circuit board is repeatedly folded and unfolded in the folding area where the display is folded, and thus the lifespan of the electronic device can be extended, and reliability of the driving can be heightened.

An electronic device (e.g., electronic device 101 of FIG. 1, electronic device of FIG. 2A, or electronic device of FIG. 4) according to an embodiment of the disclosure may include: a hinge structure (e.g., hinge structure 480 of FIG. 4 or hinge structure 600 of FIG. 6A); a flexible display (e.g., display module 160 of FIG. 1 or display 200 of FIG. 2A) configured to be folded or unfolded by the hinge structure (e.g., hinge structure 480 of FIG. 4 or hinge structure 600 of FIG. 6A); a first part (e.g., first part 401 of FIG. 4) and a second part (e.g., second part 402 of FIG. 4) configured to approach each other to face each other when being folded by the hinge structure (e.g., hinge structure 480 of FIG. 4 or hinge structure 600 of FIG. 6A) and configured to be spaced apart from each other when being unfolded by the hinge structure; a first printed circuit board (e.g., first printed circuit board 460 of FIG. 4) disposed on the first part (e.g., first part 401 of FIG. 4); a second printed circuit board (e.g., second printed circuit board 470 of FIG. 4) disposed on the second part (e.g., second part 402 of FIG. 4); and a flexible printed circuit board (e.g., flexible printed circuit board 500 of FIG. 5 or flexible printed circuit board 700 of FIGS. 7 and 8) configured to electrically connect the first printed circuit board (e.g., first printed circuit board 460 of FIG. 4) and the second printed circuit board (e.g., second printed circuit board 470 of FIG. 4) to each other, wherein the flexible printed circuit board (e.g., flexible printed circuit board 500 of FIG. 5 or flexible printed circuit board 700 of FIGS. 7 and 8) may include a first area (e.g., first part 510 of FIG. 5 or first area 701 of FIGS. 7 and 8) configured to be bent in accordance with a shape transformation (e.g., a bending/unbending) of the electronic device (e.g., electronic device 101 of FIG. 1, electronic device of FIG. 2A, or electronic device of FIG. 4), and a second area (e.g., second part 520 of FIG. 5 or second area 702 of FIGS. 7 and 8) positioned around the first area (e.g., first part 510 of FIG. 5 or first area 701 of FIGS. 7 and 8), wherein the first area (e.g., first part 510 of FIG. 5 or first area 701 of FIGS. 7 and 8) may include a single main signal wiring layer (e.g., main signal wiring layer 746 of FIGS. 7 and 8), wherein the second area (e.g., second part 520 of FIG. 5 or second area 702 of FIGS. 7 and 8) may include a plurality of signal wiring layers (e.g., first signal wiring layer 720 of FIG. 7, second signal wiring layer (e.g., second signal wiring layer 740 of FIG. 7), and third signal wiring layer (e.g., third signal wiring layer 760 of FIG. 7), and wherein the first area (e.g., first part 510 of FIG. 5 or first area 701 of FIGS. 7 and 8) and the second area (e.g., second part 520 of FIG. 5 or second area 702 of FIGS. 7 and 8) may be formed with different thicknesses.

According to an embodiment, the main signal wiring layer (e.g., main signal wiring layer 746 of FIGS. 7 and 8) may include main radio frequency (RF) signal wirings (e.g., RF signal wirings 746*a*-1, 746*a*-2, and 746*a*-3) and main ground wirings (e.g., ground wirings 746*b*-1, 746*b*-2, 7467*b*-3, and 746*b*-4 of FIG. 7), and the main RF signal wirings (e.g., RF signal wirings 746A-1 of FIG. 7) (e.g., RF signal wirings 746*a*-1, 746*a*-2, and 746*a*-3) and the main ground wirings (e.g., ground wirings 746*b*-1, 746*b*-2, 7467*b*-3, and 746*b*-4 of FIG. 7) may be disposed on the same layer.

According to an embodiment, the plurality of signal wiring layers (e.g., first signal wiring layer 720 of FIG. 7, second signal wiring layer 740 of FIG. 7, and third signal wiring layer 760 of FIG. 7) may include: a first signal wiring layer (e.g., first signal wiring layer 720 of FIG. 7) including a first flexible copper clad laminate (FCCL) conductive layer (e.g., first FCCL conductive layer 724 of FIG. 7) on which a plurality of first RF signal wirings (e.g., RF signal wirings 746A-1 of FIG. 7) and a plurality of first ground wirings (e.g., first ground wiring 924*b* of FIG. 9, first ground wiring 1024*b* of FIG. 10, first ground wiring 1124*b* of FIG. 11, and first ground wiring 1224*b* of FIG. 12) are formed; a second signal wiring layer (e.g., second signal wiring layer 740 of FIG. 7) including a second FCCL conductive layer (e.g., second FCCL conductive layer 744 of FIG. 7) on which a plurality of second RF signal wirings (e.g., RF signal wirings 746A-1 of FIG. 7) and a plurality of second ground wirings (e.g., second ground wirings 944*b* of FIG. 9) are formed; and a third signal wiring layer (e.g., third signal wirings 746A-1 of FIG. 7) including a third FCCL conductive layer (e.g., third FCCL conductive layer (e.g., third FCCL conductive layer 764 of FIG. 7) on which a plurality of third RF signal wirings (e.g., RF signal wirings 746A-1 of FIG. 7) and a plurality of third ground wirings (e.g., third ground wiring 964*b*-1 of FIG. 9, third ground wiring 1064*b* of FIG. 10, third ground wiring 1164*b* of FIG. 11, and third ground wiring 1264*b*-1 of FIG. 12) are formed.

According to an embodiment, the plurality of first RF signal wirings (e.g., RF signal wirings 746A-1 of FIG. 7) and the plurality of first ground wirings (e.g., first ground wiring 924*b* of FIG. 9, first ground wiring 1024*b* of FIG. 10, first ground wiring 1124*b* of FIG. 11, and first ground wiring 1224*b* of FIG. 12) may be disposed on the same layer; the plurality of second RF signal wirings (e.g., RF signal wirings 746A-1 of FIG. 7) and the plurality of second ground wirings (e.g., second ground wirings 944*b* of FIG. 9, second ground wirings 1044*b* of FIG. 10, second ground wirings 1144*b* of FIG. 11, and second ground wirings 1244*b* of FIG. 12) may be disposed on the same layer; the plurality of third RF signal wirings (e.g., RF signal wirings 746A-1 of FIG. 7) and the plurality of third ground wirings (e.g., third ground wiring 964*b*-1 of FIG. 9, third ground wiring 1064*b* of FIG. 10, third ground wiring 1164*b* of FIG. 11, and third ground wiring 1264*b*-1 of FIG. 12) may be disposed on the same layer; and the plurality of first RF signal wirings (e.g., RF signal wrings 746A-1 of FIG. 7), the plurality of second RF signal wirings (e.g., RF signal wirings 746A-1 of FIG. 7), and the plurality of third RF signal wirings (e.g., RF signal wirings 746A-1 of FIG. 7) may be disposed on different layers.

According to an embodiment, the electronic device may include at least one via (e.g., first vias 770*a* and second vias 770*b* of FIG. 7) electrically connecting the plurality of first ground wirings (e.g., first ground wiring 924*b* of FIG. 9, first ground wiring 1024*b* of FIG. 10, first ground wiring 1124*b* of FIG. 11, and first ground wiring 1224*b* of FIG. 12), the plurality of second ground wirings (e.g., second ground wirings 944*b* of FIG. 9, second ground wirings 1044*b* of FIG. 10, second ground wirings 1144*b* of FIG. 11, and second ground wirings 1244*b* of FIG. 12), and the plurality of third ground wirings (e.g., third ground wiring 964*b*-1 of FIG. 9, third ground wiring 1064*b* of FIG. 10, third ground wiring 1164*b* of FIG. 11, and third ground wiring 1264*b*-1 of FIG. 12) to the main ground wirings.

According to an embodiment, the main signal wiring layer (e.g., main signal wiring layer 746 of FIGS. 7 and 8) and the second signal wiring layer (e.g., second signal wiring layer 740 of FIG. 7) may be disposed on the same plane.

According to an embodiment, the first part (e.g., first part 401 of FIG. 4) may include: a dielectric layer (e.g., dielectric layer 735 of FIG. 7) disposed on the main signal wiring layer (e.g., main signal wiring layer 746 of FIGS. 7 and 8); a first FCCL protection layer (e.g., first FCCL protection layer 722 of FIG. 7) disposed on the dielectric layer (dielectric layer 735 of FIG. 7); and a first air gap (e.g., first air gap 730 of FIG. 7) formed between the dielectric layer (e.g., dielectric layer 735 of FIG. 7) and the first FCCL protection layer (e.g., first FCCL protection layer 722 of FIG. 7).

According to an embodiment, the first part (e.g., first part 401 of FIG. 4) may include: a second FCCL protection layer (e.g., second FCCL protection layer 742 of FIG. 7) disposed on a lower part of the main signal wiring layer (e.g., main signal wiring layer 746 of FIGS. 7 and 8); a third FCCL protection layer disposed on a lower part of the second FCCL protection layer (e.g., second FCCL protection layer 742 of FIG. 7); and a second air gap (e.g., second air gap 750 of FIG. 7) formed between the second FCCL protection layer (e.g., second FCCL protection layer 742 of FIG. 7) and the third FCCL protection layer.

According to an embodiment, the second part (e.g., second part 402 of FIG. 4) may include: a first adhesive layer (e.g., first adhesive layer (e.g., first adhesive layer 725 of FIG. 7) configured to make the first signal wiring layer (e.g., first signal wiring layer 720 of FIG. 7) and the second signal wiring layer (e.g., second signal wiring layer 740 of FIG. 7) adhere to each other; and a second adhesive layer (e.g., second adhesive layer 745 of FIG. 7) configured to make the second signal wiring layer (e.g., second signal wiring layer 740 of FIG. 7) and the third signal wiring layer (e.g., third signal wiring layer 760 of FIG. 7) adhere to each other.

According to an embodiment, the first signal wiring layer (e.g., first signal wiring layer 720 of FIG. 7) may include the first FCCL protection layer (e.g., first FCCL protection layer 722 of FIG. 7) disposed on a lower part of the first FCCL conductive layer (e.g., first FCCL protection layer 722 of FIG. 7); the second signal wiring layer (e.g., second signal wiring layer 740 of FIG. 7) may include the second FCCL protection layer (e.g., second FCCL protection layer 742 of FIG. 7) disposed on a lower part of the second FCCL conductive layer (e.g., second FCCL conductive layer 744 of FIG. 7); and the third signal wiring layer (e.g., third signal wiring layer 760 of FIG. 7) may include the third FCCL protection layer (e.g., third FCCL protection layer 762 of FIG. 7) disposed on the third FCCL conductive layer (e.g., third FCCL conductive layer 764 of FIG. 7).

According to an embodiment, the first air gap (e.g., first air gap 730 of FIG. 7) and the first adhesive layer (e.g., first adhesive layer 725 of FIG. 7) may be positioned on the same plane at least partly.

According to an embodiment, the dielectric layer (e.g., dielectric layer 735 of FIG. 7) and the first adhesive layer (e.g., first adhesive layer 725 of FIG. 7) may be positioned on the same plane at least partly.

According to an embodiment, the second air gap (e.g., second air gap 750 of FIG. 7) and the second adhesive layer (e.g., second adhesive layer 745 of FIG. 7) may be positioned on the same plane at least partly.

According to an embodiment, the first part (e.g., first part 401 of FIG. 4) may be formed of one or more layers having, combined, a first thickness, and the second part (e.g., second part 402 of FIG. 4) may be formed with a second thickness that is thicker than the first thickness.

According to an embodiment, the first part (e.g., first part 401 of FIG. 4) may overlap the hinge structure (e.g., hinge structure 480 of FIG. 4 or hinge structure 600 of FIG. 6A) at least partly.

A flexible printed circuit board (e.g., flexible printed circuit board 500 of FIG. 5 or flexible printed circuit board 700 of FIGS. 7 and 8) of a foldable electronic device according to embodiments of the disclosure may include: a first part (e.g., first part 401 of FIG. 4) configured to be bent in accordance with a shape transformation of the electronic device; and a second part (e.g., second part 402 of FIG. 4) positioned around the first part (e.g., first part 401 of FIG. 4); the first part (e.g., first part 401 of FIG. 4) may include a single main signal wiring layer (e.g., main signal wiring layer 746 of FIGS. 7 and 8); the second part (e.g., second part 402 of FIG. 4) may include a plurality of signal wiring layers (e.g., first signal wiring layer 720 of FIG. 7, second signal wiring layer (e.g., second signal wiring layer 740 of FIG. 7), and third signal wiring layer (e.g., third signal wiring layer 760 of FIG. 7); and the first part (e.g., first part 401 of FIG. 4) and the second part (e.g., second part 402 of FIG. 4) may be formed with different thicknesses.

According to an embodiment, the main signal wiring layer (e.g., main signal wiring layer 746 of FIGS. 7 and 8)

may include main radio frequency (RF) signal wirings and main ground wirings, and the main RF signal wirings (e.g., RF signal wirings 746A-1 of FIG. 7) and the main ground wirings may be disposed on the same layer.

According to an embodiment, the plurality of signal wiring layers (e.g., first signal wiring layer 720 of FIG. 7, second signal wiring layer 740 of FIG. 7, and third signal wiring layer 760 of FIG. 7) may include: a first signal wiring layer (e.g., first signal wiring layer 720 of FIG. 7) including a first flexible copper clad laminate (FCCL) conductive layer (e.g., first FCCL conductive layer 724 of FIG. 7) on which a plurality of first RF signal wirings (e.g., RF signal wirings 746A-1 of FIG. 7) and a plurality of first ground wirings (e.g., first ground wiring 924*b* of FIG. 9, first ground wiring 1024*b* of FIG. 10, first ground wiring 1124*b* of FIG. 11, and first ground wiring 1224*b* of FIG. 12) are formed; a second signal wiring layer (e.g., second signal wiring layer 740 of FIG. 7) including a second FCCL conductive layer (e.g., second FCCL conductive layer 744 of FIG. 7) on which a plurality of second RF signal wirings (e.g., RF signal wirings 746A-1 of FIG. 7) and a plurality of second ground wirings (e.g., second ground wirings 944*b* of FIG. 9) are formed; and a third signal wiring layer (e.g., third signal wirings 746A-1 of FIG. 7) including a third FCCL conductive layer (e.g., third FCCL conductive layer (e.g., third FCCL conductive layer 764 of FIG. 7) on which a plurality of third RF signal wirings (e.g., RF signal wirings 746A-1 of FIG. 7) and a plurality of third ground wirings (e.g., third ground wiring 964*b*-1 of FIG. 9, third ground wiring 1064*b* of FIG. 10, third ground wiring 1164*b* of FIG. 11, and third ground wiring 1264*b*-1 of FIG. 12) are formed.

According to an embodiment, the first part (e.g., first part 401 of FIG. 4) may be formed of one or more layers having, combined, a first thickness, and the second part (e.g., second part 402 of FIG. 4) may be formed with a second thickness that is thicker than the first thickness.

According to an embodiment, the first part (e.g., first part 401 of FIG. 4) may overlap a fold position of the foldable electronic device.

Although the contents of the disclosure have been illustrated and described with reference to the various embodiments thereof, it will be understood by those of skilled in the art that various changes of the shapes and details can be made without departing from the idea and scope of the contents of the disclosure as follows. They are defined by the appended claims and their equivalents.

The invention claimed is:

1. An electronic device comprising:

a hinge structure;

a flexible display configured to be folded or unfolded by the hinge structure;

a first part and a second part coupled to the hinge structure, the first part and the second part configured to approach each other to face each other when being folded by the hinge structure and configured to be spaced apart from each other when being unfolded by the hinge structure;

a first printed circuit board disposed on the first part;

a second printed circuit board disposed on the second part; and a flexible printed circuit board configured to electrically connect the first printed circuit board and the second printed circuit board to each other, wherein the flexible printed circuit board includes:

a first area configured to be bent in response to a folding or an unfolding of the electronic device; and a second area positioned around the first area, the second area not bent in response to the folding or the unfolding of the electronic device, wherein the first area and the second area are formed with different thicknesses;

wherein the first area comprises a single signal wiring layer and the second area comprises a plurality of signal wiring layers having more signal wiring layers than the first area;

wherein the plurality of signal wiring layers comprises a first signal wiring layer, a second signal wiring layer, and a third signal wiring layer, wherein the first signal wiring layer includes a first flexible copper clad laminate (FCCL) conductive layer and a first FCCL protection layer disposed on a lower part of the first FCCL conductive layer, wherein the second signal wiring layer includes a second FCCL conductive layer and a second FCCL protection layer disposed on a lower part of the second FCCL conductive layer, and wherein the third signal wiring layer includes a third FCCL conductive layer and a third FCCL protection layer disposed on the third FCCL conductive layer.

2. The electronic device of claim 1, wherein the signal wiring layer comprises main radio frequency (RF) signal wirings and main ground wirings, and wherein the main RF signal wirings and the main ground wirings are disposed on the same layer.

3. The electronic device of claim 2, wherein the first signal wiring layer further includes a plurality of first RF signal wirings and a plurality of first ground wirings formed on the first FCCL conductive layer, wherein the second signal wiring layer further includes a plurality of second RF signal wirings and a plurality of second ground wirings formed on the second FCCL conductive layer, and wherein the third signal wiring layer further includes a plurality of third RF signal wirings and a plurality of third ground wirings formed on the third FCCL conductive layer.

4. The electronic device of claim 3, wherein the plurality of first RF signal wirings and the plurality of first ground wirings are disposed on the same layer, wherein the plurality of second RF signal wirings and the plurality of second ground wirings are disposed on the same layer;

wherein the plurality of third RF signal wirings and the plurality of third ground wirings are disposed on the same layer; and wherein the plurality of first RF signal wirings, the plurality of second RF signal wirings, and the plurality of third RF signal wirings are disposed on different layers.

5. The electronic device of claim 4, comprising at least one via electrically connecting the plurality of first ground wirings, the plurality of second ground wirings, and the plurality of third ground wirings to the main ground wirings.

6. The electronic device of claim 4, wherein the signal wiring layer and the second signal wiring layer are disposed on a same plane.

7. The electronic device of claim 4, wherein the first part comprises:

a dielectric layer disposed on the signal wiring layer;

the first FCCL protection layer disposed on the dielectric layer; and a first air gap formed between the dielectric layer and the first FCCL protection layer.

8. The electronic device of claim 7, wherein the first part comprises:

the second FCCL protection layer disposed on a lower part of the signal wiring layer;

the third FCCL protection layer disposed on a lower part of the second FCCL protection layer; and a second air gap formed between the second FCCL protection layer and the third FCCL protection layer.

9. The electronic device of claim 8, wherein the second part comprises:

a first adhesive layer configured to make the first signal wiring layer and the second signal wiring layer adhere to each other, and a second adhesive layer configured to make the second signal wiring layer and the third signal wiring layer adhere to each other.

10. The electronic device of claim 9, wherein the first air gap and the first adhesive layer are positioned on a same plane at least partly.

11. The electronic device of claim 9, wherein the dielectric layer and the first adhesive layer are positioned on a same plane at least partly.

12. The electronic device of claim 9, wherein the second air gap and the second adhesive layer are positioned on a same plane at least partly.

13. The electronic device of claim 1, wherein the first part is formed of one or more layers having, combined, a first thickness, and wherein the second part is formed with a second thickness that is thicker than the first thickness.

14. The electronic device of claim 13, wherein the first part overlaps the hinge structure at least partly.

15. The electronic device of claim 1, wherein, in a cross-section viewed in a first direction corresponding to a folding axis defined by the hinge structure, the first area includes the single signal wiring layer.

16. The electronic device of claim 1, wherein, in a cross-section defined by a second direction orthogonal to a folding axis defined by the hinge structure, the single signal wiring layer includes a plurality of signal wirings and at least one ground wiring.

17. A flexible printed circuit board of a foldable electronic device comprising:

a first part configured to be bent in response to a folding or an unfolding of the electronic device; and a second part positioned around the first part, the second part not bent in response to the folding or the unfolding of the electronic device, wherein the first part and the second part are formed with different thicknesses;

wherein the first part comprises a single signal wiring layer and the second part comprises a plurality of signal wiring layers having more signal wiring layers than the first part, wherein the plurality of signal wiring layers comprises a first signal wiring layer, a second signal wiring layer, and a third signal wiring layer, wherein the first signal wiring layer includes a first flexible copper clad laminate (FCCL) conductive layer and a first FCCL protection layer disposed on a lower part of the first FCCL conductive layer, wherein the second signal wiring layer includes a second FCCL conductive layer and a second FCCL protection layer disposed on a lower part of the second FCCL conductive layer, and wherein the third signal wiring layer includes a third FCCL conductive layer and a third FCCL protection layer disposed on the third FCCL conductive layer.

18. The flexible printed circuit board of claim 17, wherein the signal wiring layer comprises main radio frequency (RF) signal wirings and main ground wirings, and wherein the main RF signal wirings and the main ground wirings are disposed on the same layer.

19. The flexible printed circuit board of claim 17, wherein the first signal wiring layer further includes a plurality of first RF signal wirings and a plurality of first ground wirings formed on the first FCCL conductive layer, wherein the second signal wiring layer further includes a plurality of second RF signal wirings and a plurality of second ground wirings formed on the second FCCL conductive layer, and wherein the third signal wiring layer further includes a plurality of third RF signal wirings and a plurality of third ground wirings formed on the third FCCL conductive layer.

20. The flexible printed circuit board of claim 17, wherein the first part is formed of one or more layers having, combined, a first thickness, and wherein the second part is formed with a second thickness that is thicker than the first thickness.

21. The flexible printed circuit board of claim 17, wherein the first part overlaps a fold position of the foldable electronic device at least partly.

* * * * *